(12) United States Patent
Sasaki et al.

(10) Patent No.: US 8,176,623 B2
(45) Date of Patent: May 15, 2012

(54) METHOD OF MANUFACTURING A MAGNETIC HEAD FOR PERPENDICULAR MAGNETIC RECORDING

(75) Inventors: Yoshitaka Sasaki, Milpitas, CA (US); Hiroyuki Itoh, Milpitas, CA (US); Shigeki Tanemura, Milpitas, CA (US); Hironori Araki, Milpitas, CA (US); Kazuo Ishizaki, Milpitas, CA (US); Takehiro Horinaka, Milpitas, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1179 days.

(21) Appl. No.: 12/003,347

(22) Filed: Dec. 21, 2007

(65) Prior Publication Data

US 2009/0162699 A1 Jun. 25, 2009

(51) Int. Cl.
*G11B 5/187* (2006.01)
*G11B 5/17* (2006.01)

(52) U.S. Cl. ............. 29/603.15; 29/603.13; 29/603.14; 29/603.16; 360/125.13; 360/125.14; 360/125.2; 360/125.46; 360/125.51

(58) Field of Classification Search ............. 29/603.07, 29/603.13, 603.14, 603.15, 603.16, 603.23; 360/125.12, 125.13, 125.14, 125.19, 125.2, 360/125.46, 125.51, 125.59

See application file for complete search history.

(56) References Cited

U.S. PATENT DOCUMENTS

| 7,518,824 B2 | 4/2009 | Sasaki et al. |
| 2003/0151850 A1 | 8/2003 | Nakamura et al. |
| 2006/0002014 A1* | 1/2006 | Sasaki et al. ............. 360/125 |
| 2006/0077589 A1 | 4/2006 | Sasaki et al. |

FOREIGN PATENT DOCUMENTS

| JP | A-07-176018 | 7/1995 |
| JP | A-2000-200717 | 7/2000 |
| JP | A-2006-228315 | 8/2006 |
| JP | A-2006-252753 | 9/2006 |
| JP | 2008300027 A * | 12/2008 |

OTHER PUBLICATIONS

Japanese Office Action issued in Application No. 2008-185707; Dated Jul. 23, 2010 (With Translation).

* cited by examiner

*Primary Examiner* — A. Dexter Tugbang
(74) *Attorney, Agent, or Firm* — Oliff & Berridge, PLC

(57) ABSTRACT

A method of manufacturing the magnetic head includes the steps of: forming the pole-layer-encasing layer; forming an initial nonmagnetic layer in the groove of the pole-layer-encasing layer by physical vapor deposition, the initial nonmagnetic layer being intended to become the nonmagnetic layer later by undergoing etching of a surface thereof; etching the surface of the initial nonmagnetic layer by dry etching so that the initial nonmagnetic layer becomes the nonmagnetic layer; and forming the pole layer in the pole-layer-encasing section formed by the nonmagnetic layer.

12 Claims, 18 Drawing Sheets

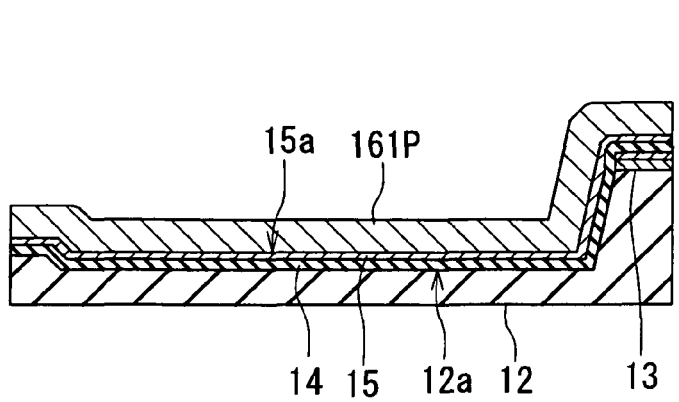 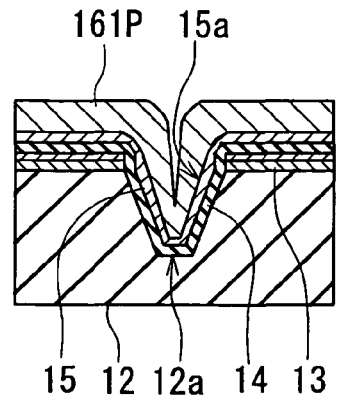
FIG. 7A  FIG. 7B
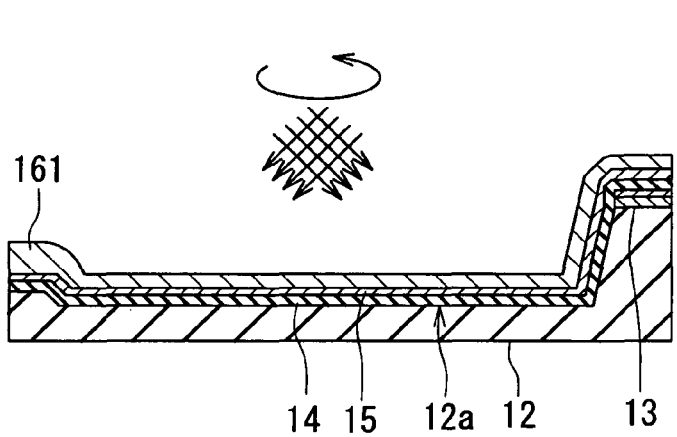 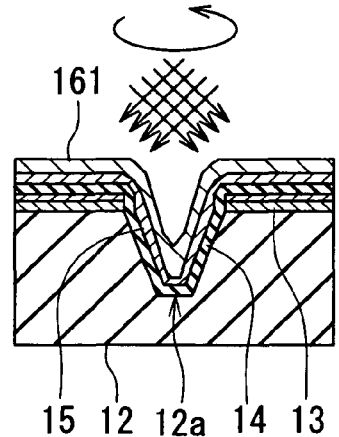
FIG. 8A  FIG. 8B
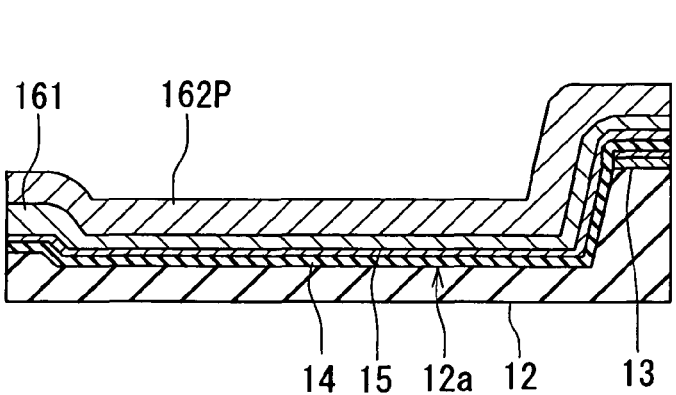 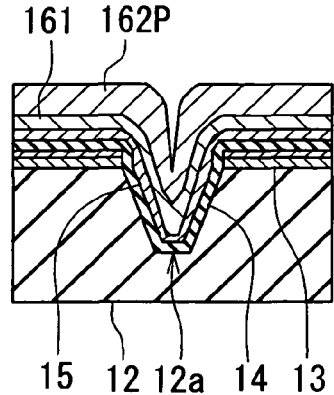
FIG. 9A  FIG. 9B 115 12 12a 14 13

115 12 12a 14 13

115 12 12a 14 13

15 12 12a 14 13

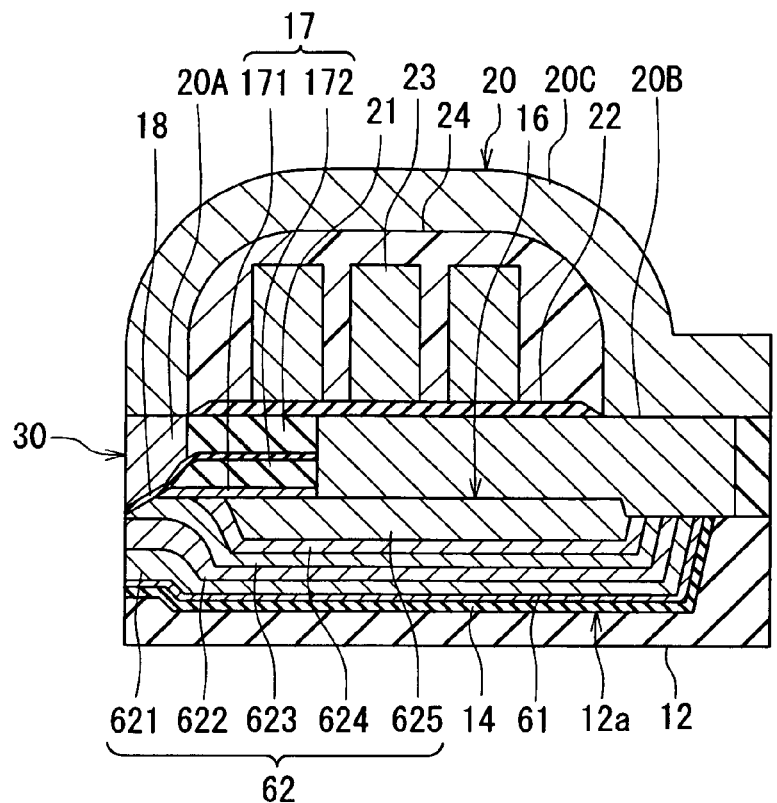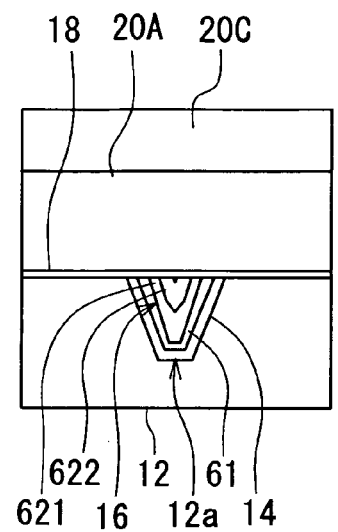
FIG. 25A  FIG. 25B
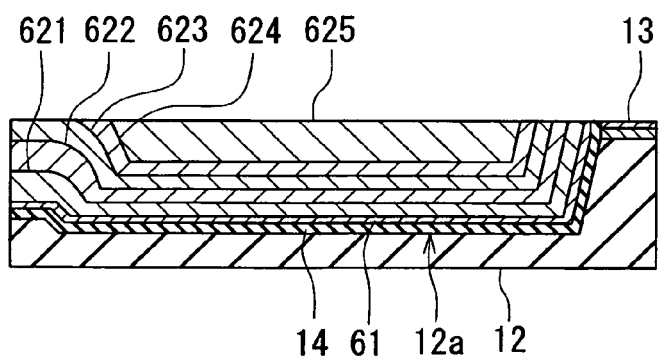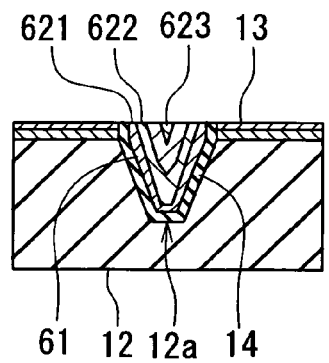
FIG. 26A  FIG. 26B

METHOD OF MANUFACTURING A MAGNETIC HEAD FOR PERPENDICULAR MAGNETIC RECORDING

BACKGROUND OF THE INVENTION

1. Field of the Invention

The present invention relates to a magnetic head for perpendicular magnetic recording that is used for writing data on a recording medium by means of a perpendicular magnetic recording system, and to a method of manufacturing such a magnetic head.

2. Description of the Related Art

The recording systems of magnetic read/write devices include a longitudinal magnetic recording system wherein signals are magnetized in the direction along the plane of the recording medium (the longitudinal direction) and a perpendicular magnetic recording system wherein signals are magnetized in the direction perpendicular to the plane of the recording medium. It is known that the perpendicular magnetic recording system is harder to be affected by thermal fluctuation of the recording medium and capable of implementing higher linear recording density, compared with the longitudinal magnetic recording system.

Typically, magnetic heads for perpendicular magnetic recording have a structure in which a reproducing (read) head having a magnetoresistive element (that may be hereinafter referred to as an MR element) for reading and a recording (write) head having an induction-type electromagnetic transducer for writing are stacked on a substrate, like magnetic heads for longitudinal magnetic recording. The write head includes a pole layer that generates a magnetic field in the direction perpendicular to the plane of the recording medium. The pole layer includes, for example, a track width defining portion having an end located in a medium facing surface that faces toward the recording medium, and a wide portion that is coupled to the other end of the track width defining portion and that is greater in width than the track width defining portion. The track width defining portion has a nearly uniform width.

For the perpendicular magnetic recording system, it is an improvement in recording medium and an improvement in write head that mainly contributes to an improvement in recording density. It is a reduction in track width and an improvement in write characteristics that is particularly required for the write head to achieve higher recording density. On the other hand, if the track width is reduced, the write characteristics, such as an overwrite property that is a parameter indicating an overwriting capability, suffer degradation. It is therefore required to achieve better write characteristics as the track width becomes smaller. Here, the length of the track width defining portion taken in the direction perpendicular to the medium facing surface is called a neck height. The smaller the neck height, the better is the overwrite property.

A magnetic head for use in a magnetic disk drive such as a hard disk drive is typically provided in a slider. The slider has the medium facing surface mentioned above. The medium facing surface has an air-inflow-side end and an air-outflow-side end. The slider is designed to slightly fly over the surface of the recording medium by means of an airflow that comes from the air-inflow-side end into the space between the medium facing surface and the recording medium. The magnetic head is typically disposed near the air-outflow-side end of the medium facing surface of the slider. In a magnetic disk drive, the magnetic head is aligned through the use of a rotary actuator, for example. In this case, the magnetic head moves over the recording medium along a circular orbit about the center of rotation of the rotary actuator. In such a magnetic disk drive, a tilt of the magnetic head with respect to the tangent of the circular track, which is called a skew, occurs in accordance with the position of the magnetic head across the tracks.

In a magnetic disk drive of the perpendicular magnetic recording system, in particular, which exhibits a better capability of writing on a recording medium compared with the longitudinal magnetic recording system, if the above-mentioned skew occurs, there arise problems such as a phenomenon in which, when data is written on a certain track, data stored on a track adjacent thereto is erased (this is hereinafter called adjacent track erasing), or unwanted writing between two adjacent tracks. To achieve higher recording density, it is required to suppress adjacent track erasing. Unwanted writing between two adjacent tracks affects detection of servo signals for alignment of the magnetic head and the signal-to-noise ratio of a read signal.

As one of techniques for preventing the problems resulting from the skew described above, there is known a technique in which an end face of the track width defining portion located in the medium facing surface is formed into such a shape that the side located backward along the direction of travel of the recording medium (that is, the side located closer to the air inflow end of the slider) is shorter than the opposite side, as disclosed in U.S. Patent Application Publication No. US 2003/0151850 A1, for example. For magnetic heads, typically, in the medium facing surface, the end farther from the substrate is located forward along the direction of travel of the recording medium (that is, located closer to the air outflow end of the slider). Therefore, the shape of the end face of the track width defining portion located in the medium facing surface mentioned above is such that the side closer to the substrate is shorter than the side farther from the substrate.

U.S. Patent Application Publication No. 2003/0151850 A1 discloses a process of forming a groove having a shape corresponding to the pole layer in an inorganic insulating film, and forming the pole layer in the groove by plating or sputtering. According to this process, the width of the pole layer, that is, the track width, is defined by the width of the groove formed in the inorganic insulating film. This U.S. publication further discloses that, when the pole layer is formed in the groove by plating, a stopper film used for CMP may be formed after the plating base film is formed.

U.S. Patent Application Publication No. US 2006/0077589 A1 discloses a method of forming the pole layer as described below. In this method, first, a polishing stopper layer having a penetrating opening whose shape corresponds to the plane geometry of the pole layer is formed on the top surface of a nonmagnetic layer. Next, a portion of the nonmagnetic layer exposed from the opening of the polishing stopper layer is selectively etched to thereby form a groove in the nonmagnetic layer, and a magnetic layer to become the pole layer is formed such that the groove is filled with the magnetic layer and that the top surface of the magnetic layer is located higher than the top surface of the polishing stopper layer. Next, a coating layer is formed to cover the magnetic layer and the polishing stopper layer. Next, the coating layer and the magnetic layer are polished until the polishing stopper layer is exposed, so that the magnetic layer becomes the pole layer. This method makes it possible to precisely control the thickness of the pole layer that has an influence on the write characteristics, and the width of the top surface of the pole layer that defines the track width.

One of approaches for improving write characteristics is to form the pole layer using a magnetic material having a high saturation flux density. For example, CoFe is one of magnetic materials having a high saturation flux density. On the other hand, it is known that a magnetic layer formed by physical vapor deposition such as sputtering may have a higher saturation flux density compared with a magnetic layer formed by plating. For example, a CoFe layer formed by plating has a saturation flux density of approximately 2.3 T, whereas a CoFe layer formed by physical vapor deposition has a saturation flux density of approximately 2.4 T.

In view of this, forming a CoFe layer to become the pole layer by physical vapor deposition in a groove of a nonmagnetic layer would be a possible approach for improving the write characteristics and also precisely controlling the write characteristics and the track width.

On the other hand, to achieve higher recording density, a reduction in track width is required, and to achieve this, it is necessary to reduce the width of the above-mentioned groove. When the pole layer is formed in a narrow groove by physical vapor deposition, however, there arise a problem that defects such as key holes can easily occur in the pole layer.

Furthermore, forming the pole layer in a groove by physical vapor deposition can sometimes include a process in which a thin seed layer made of a nonmagnetic metal material or a magnetic material is first formed in the groove by sputtering, and then a thick magnetic layer is formed on this seed layer by physical vapor deposition. In this case, the surface of the seed layer formed in the groove becomes a rough surface on which a columnar crystal appears. Consequently, if a magnetic layer is formed on this seed layer by physical vapor deposition, the magnetic layer is poor in quality of the crystal, and this results in degradation in characteristics of the pole layer.

In the case of forming the pole layer by plating in a narrow groove, there also arise a problem as described below. To form the pole layer in a groove by plating, typically, a thin seed layer made of a nonmagnetic metal material or a magnetic material is first formed in the groove by sputtering, for example, and then a plating layer made of a magnetic material is formed on the seed layer by plating. In this case, as mentioned above, the surface of the seed layer formed in the groove becomes a rough surface on which a columnar crystal appears. Consequently, if a plating layer is formed on this seed layer, the plating layer is poor in quality of the crystal, and this results in degradation in characteristics of the pole layer.

OBJECT AND SUMMARY OF THE INVENTION

It is an object of the present invention to provide a method of manufacturing a magnetic head for perpendicular magnetic recording that enables formation of a pole layer of good quality in a groove of a nonmagnetic layer, and to provide a magnetic head for perpendicular magnetic recording having a pole layer of good quality manufactured by this method.

A magnetic head for perpendicular magnetic recording manufactured by a first manufacturing method of the present invention includes: a medium facing surface that faces toward a recording medium; a coil that generates a magnetic field corresponding to data to be written on the recording medium; a pole layer that allows a magnetic flux corresponding to the magnetic field generated by the coil to pass therethrough and generates a write magnetic field for writing the data on the recording medium by means of a perpendicular magnetic recording system; a pole-layer-encasing layer made of a nonmagnetic material and having a top surface and a groove that opens at the top surface; and a nonmagnetic layer that is made of a nonmagnetic metal material, disposed in the groove and forms a pole-layer-encasing section that accommodates the pole layer.

The first method of manufacturing the magnetic head for perpendicular magnetic recording of the present invention includes the steps of: forming the pole-layer-encasing layer; forming an initial nonmagnetic layer in the groove of the pole-layer-encasing layer by physical vapor deposition, the initial nonmagnetic layer being intended to become the nonmagnetic layer later by undergoing etching of a surface thereof; etching the surface of the initial nonmagnetic layer by dry etching so that the initial nonmagnetic layer becomes the nonmagnetic layer; forming the pole layer in the pole-layer-encasing section formed by the nonmagnetic layer; and forming the coil.

In the first method of manufacturing the magnetic head for perpendicular magnetic recording of the invention, the initial nonmagnetic layer forms an initial encasing section that is to become the pole-layer-encasing section later, and the initial encasing section has an opening. In the step of etching the surface of the initial nonmagnetic layer, the surface of the initial nonmagnetic layer is etched so that the opening becomes wider than before the etching and the initial encasing section thereby becomes the pole-layer-encasing section.

In the first method of manufacturing the magnetic head for perpendicular magnetic recording of the invention, the pole layer may have: a track width defining portion that defines a track width, the track width defining portion including a first end located in the medium facing surface and a second end opposite to the first end; and a wide portion coupled to the second end of the track width defining portion and having a width greater than that of the track width defining portion.

In the first method of manufacturing the magnetic head for perpendicular magnetic recording of the invention, the pole layer may have an end face located in the medium facing surface, and this end face may have a width that decreases with increasing distance from the top surface of the pole-layer-encasing layer.

In the first method of manufacturing the magnetic head for perpendicular magnetic recording of the invention, the surface of the initial nonmagnetic layer may be smoothed through the step of etching the surface of the initial nonmagnetic layer.

In the first method of manufacturing the magnetic head for perpendicular magnetic recording of the invention, the step of etching the surface of the initial nonmagnetic layer may be performed by ion beam etching.

The magnetic head for perpendicular magnetic recording manufactured by the first manufacturing method of the invention may further include a substrate on which the pole-layer-encasing layer, the nonmagnetic layer, the pole layer and the coil are stacked. Furthermore, the groove of the pole-layer-encasing layer may have two walls located on opposite sides in the track width direction, and the two walls may be each inclined at a first angle with respect to a direction perpendicular to the top surface of the substrate so that the distance between the two walls decreases with decreasing distance from the top surface of the substrate. In this case, the step of etching the surface of the initial nonmagnetic layer may be performed by ion beam etching such that the direction of travel of ion beams forms a second angle greater than the first angle with respect to the direction perpendicular to the top surface of the substrate.

In the first method of manufacturing the magnetic head for perpendicular magnetic recording of the invention, in the step of forming the pole layer, at least part of the pole layer may be formed by physical vapor deposition.

In the first method of manufacturing the magnetic head for perpendicular magnetic recording of the invention, in the step of forming the pole layer, at least part of the pole layer may be formed by plating.

In the first method of manufacturing the magnetic head for perpendicular magnetic recording of the invention, the pole layer may include a plurality of magnetic films stacked on the nonmagnetic layer. In this case, in the step of forming the pole layer, each of the plurality of magnetic films except one located uppermost may be formed by: first forming an initial magnetic film by physical vapor deposition, the initial magnetic film being intended to become the magnetic film later by undergoing etching of a surface thereof, and then etching the surface of the initial magnetic film by dry etching so that the initial magnetic film becomes the magnetic film. Furthermore, in this case, the one of the plurality of magnetic films located uppermost may be formed by plating.

In the first method of manufacturing the magnetic head for perpendicular magnetic recording of the invention, the pole layer may include: a plurality of magnetic films stacked on the nonmagnetic layer; and a nonmagnetic film made of a nonmagnetic material and inserted between vertically adjacent ones of the magnetic films. In this case, the magnetic films and the nonmagnetic film may be alternately formed in the step of forming the pole layer.

In the first method of manufacturing the magnetic head for perpendicular magnetic recording of the invention, the pole layer may include: a plurality of magnetic films stacked on the nonmagnetic layer and each made of a magnetic metal material; and an oxide magnetic material film made of an oxide magnetic material and inserted between vertically adjacent ones of the magnetic films. In this case, the step of forming the pole layer may include: a step of forming a magnetic metal material film made of a magnetic metal material; and a step of subjecting a surface of the magnetic metal material film to oxidation, thereby forming the oxide magnetic material film from an oxidized portion of the magnetic metal material film and forming the magnetic film from a non-oxidized portion of the magnetic metal material film.

A magnetic head for perpendicular magnetic recording manufactured by a second manufacturing method of the present invention includes: a medium facing surface that faces toward a recording medium; a coil that generates a magnetic field corresponding to data to be written on the recording medium; a pole layer that allows a magnetic flux corresponding to the magnetic field generated by the coil to pass therethrough and generates a write magnetic field for writing the data on the recording medium by means of a perpendicular magnetic recording system; and a pole-layer-encasing layer made of a nonmagnetic material and having a top surface and a pole-layer-encasing section formed of a groove that opens at the top surface and that accommodates the pole layer, wherein the pole layer includes a first layer made of a magnetic material and a second layer formed on the first layer.

The second method of manufacturing the magnetic head for perpendicular magnetic recording of the invention includes the steps of: forming the pole-layer-encasing layer; forming the pole layer in the pole-layer-encasing section of the pole-layer-encasing layer; and forming the coil.

In the second method of manufacturing the magnetic head for perpendicular magnetic recording of the invention, the step of forming the pole layer includes the steps of forming an initial first layer by physical vapor deposition, the initial first layer being intended to become the first layer later by undergoing etching of a surface thereof, etching the surface of the initial first layer by dry etching so that the initial first layer becomes the first layer; and forming the second layer on the first layer. The initial first layer forms a groove having an opening. In the step of etching the surface of the initial first layer, the surface of the initial first layer is etched such that the opening becomes wider than before the etching.

In the second method of manufacturing the magnetic head for perpendicular magnetic recording of the invention, the pole layer may have: a track width defining portion that defines a track width, the track width defining portion including a first end located in the medium facing surface and a second end opposite to the first end; and a wide portion coupled to the second end of the track width defining portion and having a width greater than that of the track width defining portion.

In the second method of manufacturing the magnetic head for perpendicular magnetic recording of the invention, the pole layer may have an end face located in the medium facing surface, and this end face may have a width that decreases with increasing distance from the top surface of the pole-layer-encasing layer.

In the second method of manufacturing the magnetic head for perpendicular magnetic recording of the invention, the surface of the initial first layer may be smoothed in the step of etching the surface of the initial first layer.

In the second method of manufacturing the magnetic head for perpendicular magnetic recording of the invention, the step of etching the surface of the initial first layer may be performed by ion beam etching.

The magnetic head for perpendicular magnetic recording manufactured by the second manufacturing method of the invention may further include a substrate on which the pole-layer-encasing layer, the pole layer and the coil are stacked. Furthermore, the groove of the pole-layer-encasing layer may have two walls located on opposite sides in the track width direction, and the two walls may be each inclined at a first angle with respect to a direction perpendicular to the top surface of the substrate so that the distance between the two walls decreases with decreasing distance from the top surface of the substrate. In this case, the step of etching the surface of the initial first layer may be performed by ion beam etching such that the direction of travel of ion beams forms a second angle greater than the first angle with respect to the direction perpendicular to the top surface of the substrate.

In the second method of manufacturing the magnetic head for perpendicular magnetic recording of the invention, in the step of forming the second layer, at least part of the second layer may be formed by physical vapor deposition.

In the second method of manufacturing the magnetic head for perpendicular magnetic recording of the invention, in the step of forming the second layer, at least part of the second layer may be formed by plating.

In the second method of manufacturing the magnetic head for perpendicular magnetic recording of the invention, the second layer may include a plurality of magnetic films stacked on the first layer. In this case, in the step of forming the second layer, each of the plurality of magnetic films except one located uppermost may be formed by: first forming an initial magnetic film by physical vapor deposition, the initial magnetic film being intended to become the magnetic film later by undergoing etching of a surface thereof, and then etching the surface of the initial magnetic film by dry etching so that the initial magnetic film becomes the magnetic film. Furthermore, in this case, the one of the plurality of magnetic films located uppermost may be formed by plating.

In the second method of manufacturing the magnetic head for perpendicular magnetic recording of the invention, the second layer may include: a plurality of magnetic films stacked on the first layer; and a nonmagnetic film made of a nonmagnetic material and inserted between vertically adjacent ones of the magnetic films. In this case, the magnetic films and the nonmagnetic film may be alternately formed in the step of forming the second layer.

In the second method of manufacturing the magnetic head for perpendicular magnetic recording of the invention, the second layer may include: a plurality of magnetic films stacked on the first layer and each made of a magnetic metal material; and an oxide magnetic material film made of an oxide magnetic material and inserted between vertically adjacent ones of the magnetic films. In this case, the step of forming the second layer may include: a step of forming a magnetic metal material film made of a magnetic metal material; and a step of subjecting a surface of the magnetic metal material film to oxidation, thereby forming the oxide magnetic material film from an oxidized portion of the magnetic metal material film and forming the magnetic film from a non-oxidized portion of the magnetic metal material film.

A magnetic head for perpendicular magnetic recording of the present invention includes: a medium facing surface that faces toward a recording medium; a coil that generates a magnetic field corresponding to data to be written on the recording medium; a pole layer that allows a magnetic flux corresponding to the magnetic field generated by the coil to pass therethrough and generates a write magnetic field for writing the data on the recording medium by means of a perpendicular magnetic recording system; and a pole-layer-encasing layer made of a nonmagnetic material and having a top surface and a groove that opens at the top surface and that accommodates the pole layer, wherein the pole layer has: a track width defining portion that defines a track width, the track width defining portion including a first end located in the medium facing surface and a second end opposite to the first end; and a wide portion coupled to the second end of the track width defining portion and having a width greater than that of the track width defining portion.

The pole layer includes a plurality of magnetic films stacked. At least one of the plurality of magnetic films includes: a first portion included in the track width defining portion, the first portion having a first thickness in a cross section passing through a center of the pole layer taken in the track width direction; a second portion included in the wide portion, the second portion having a second thickness in the cross section passing through the center of the pole layer taken in the track width direction, the second thickness being smaller than the first thickness; and a third portion that couples the first portion and the second portion to each other. In the cross section passing through the center of the pole layer taken in the track width direction, the top surface of the third portion is inclined with respect to the direction perpendicular to the medium facing surface.

In the magnetic head for perpendicular magnetic recording of the invention, the pole layer may have an end face located in the medium facing surface, and this end face may have a width that decreases with increasing distance from the top surface of the pole-layer-encasing layer.

In the magnetic head for perpendicular magnetic recording of the invention, one of the plurality of magnetic films that is located uppermost may have a saturation flux density different from that of each of the other ones of the plurality of magnetic films.

In the magnetic head for perpendicular magnetic recording of the invention, the pole layer may further include a nonmagnetic film made of a nonmagnetic material and inserted between vertically adjacent ones of the magnetic films.

In the magnetic head for perpendicular magnetic recording of the invention, the pole layer may further include an oxide magnetic material film made of an oxide magnetic material and inserted between vertically adjacent ones of the magnetic films.

According to the first method of manufacturing the magnetic head for perpendicular magnetic recording of the invention, the initial nonmagnetic layer is formed in the groove of the pole-layer-encasing layer by physical vapor deposition, and this initial nonmagnetic layer forms the initial encasing section having an opening. Then, the surface of the initial nonmagnetic layer is etched so that the opening becomes wider than before the etching and the initial encasing section thereby becomes the pole-layer-encasing section. Thereafter, the pole layer is formed in the pole-layer-encasing section formed by the nonmagnetic layer. The first method of manufacturing the magnetic head for perpendicular magnetic recording of the invention makes it possible to form the pole layer of good quality in the groove of the pole-layer-encasing layer.

According to the second method of manufacturing the magnetic head for perpendicular magnetic recording of the invention, in the step of forming the pole layer in the pole-layer-encasing section of the pole-layer-encasing layer, the initial first layer is formed by physical vapor deposition, and the initial first layer forms a groove having an opening. Then, the surface of the initial first layer is etched so that the opening becomes wider than before the etching and the initial first layer thereby becomes the first layer. Thereafter, the second layer is formed on the first layer. The second method of manufacturing the magnetic head for perpendicular magnetic recording of the invention makes it possible to form the pole layer of good quality in the groove of the pole-layer-encasing layer.

According to the magnetic head for perpendicular magnetic recording of the invention, the pole layer includes a plurality of magnetic films stacked. At least one of the plurality of magnetic films includes: a first portion included in the track width defining portion, the first portion having a first thickness in the cross section passing through the center of the pole layer taken in the track width direction; a second portion included in the wide portion, the second portion having a second thickness in the cross section passing through the center of the pole layer taken in the track width direction, the second thickness being smaller than the first thickness; and a third portion that couples the first portion and the second portion to each other. In the cross section passing through the center of the pole layer taken in the track width direction, the top surface of the third portion is inclined with respect to the direction perpendicular to the medium facing surface. The magnetic head for perpendicular magnetic recording of the invention makes it possible to suppress the occurrence of a phenomenon in which data stored on a recording medium is erased due to residual magnetization in the pole layer after a writing operation.

Other objects, features and advantages of the present invention will become fully apparent from the following description.

BRIEF DESCRIPTION OF THE DRAWINGS

FIG. 7A and FIG. 7B are views illustrating a step that follows the step of FIG. 6A and FIG. 6B.

FIG. 8A and FIG. 8B are views illustrating a step that follows the step of FIG. 7A and FIG. 7B.

FIG. 9A and FIG. 9B are views illustrating a step that follows the step of FIG. 8A and FIG. 8B.

FIG. 25A is a cross-sectional view illustrating the configuration of a magnetic head of a fifth embodiment of the invention.

FIG. 25B is a front view of the medium facing surface of the magnetic head of the fifth embodiment of the invention.

FIG. 26A and FIG. 26B are views illustrating a step of a method of manufacturing the magnetic head of the fifth embodiment of the invention.

DETAILED DESCRIPTION OF THE PREFERRED EMBODIMENTS

First Embodiment

Figure 1:
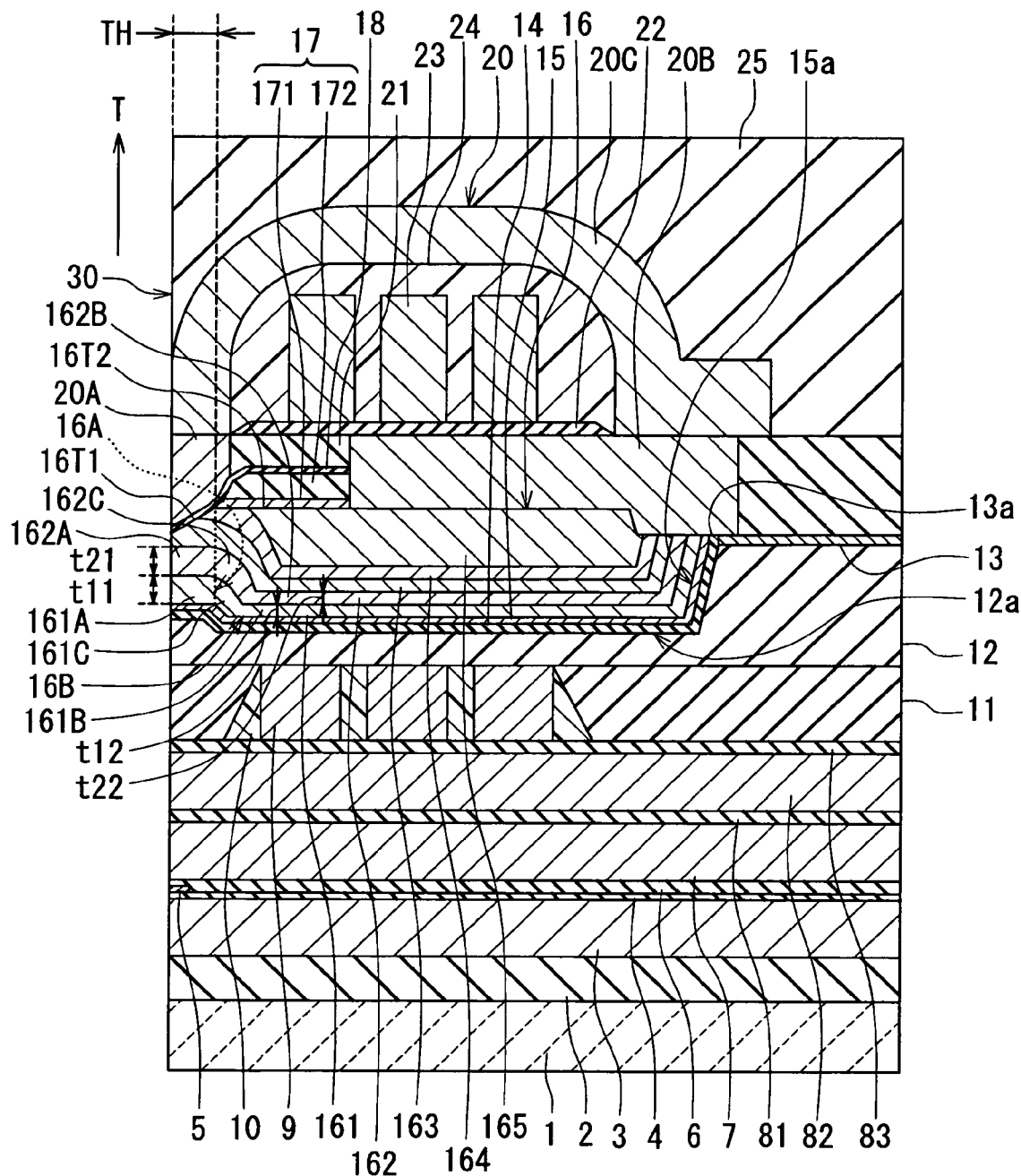
FIG. 1 is a cross-sectional view illustrating the configuration of a magnetic head of a first embodiment of the invention.
Figure 2:
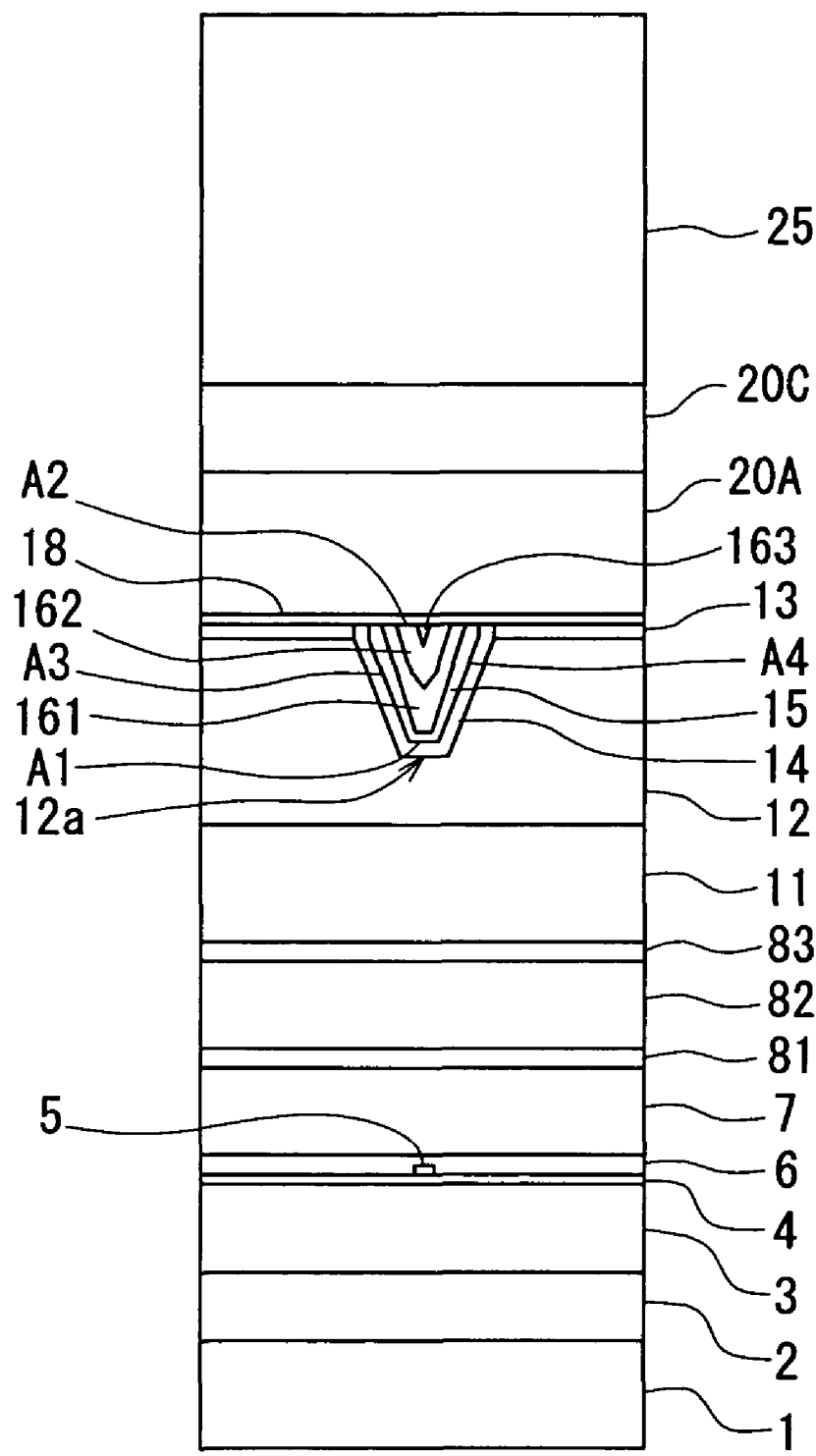
FIG. 2 is a front view of the medium facing surface of the magnetic head of the first embodiment of the invention.

Embodiments of the present invention will now be described in detail with reference to the drawings. Reference is first made to FIG. 1 and FIG. 2 to describe the configuration of a magnetic head for perpendicular magnetic recording of a first embodiment of the invention. FIG. 1 is a cross-sectional view illustrating the configuration of the magnetic head for perpendicular magnetic recording of the embodiment. FIG. 1 shows a cross section that is perpendicular to the medium facing surface and the top surface of the substrate, and that passes through a center of a pole layer taken in the track width direction. In FIG. 1 the arrow marked with T shows the direction of travel of a recording medium. FIG. 2 is a front view of the medium facing surface of the magnetic head for perpendicular magnetic recording of the embodiment.

As illustrated in FIG. 1 and FIG. 2, the magnetic head for perpendicular magnetic recording (hereinafter simply called the magnetic head) of the embodiment includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a bottom shield layer 3 made of a magnetic material and disposed on the insulating layer 2; a bottom shield gap film 4 that is an insulating film disposed on the bottom shield layer 3; a magnetoresistive (MR) element 5 as a read element disposed on the bottom shield gap film 4; a top shield gap film 6 that is an insulating film disposed on the MR element 5; and a first top shield layer 7 made of a magnetic material and disposed on the top shield gap film 6.

An end of the MR element 5 is located in the medium facing surface 30 that faces toward the recording medium. The MR element 5 may be an element made of a magneto-sensitive film that exhibits a magnetoresistive effect, such as an AMR (anisotropic magnetoresistive) element, a GMR (giant magnetoresistive) element, or a TMR (tunneling magnetoresistive) element. The GMR element may be of a CIP (current-in-plane) type wherein a current used for detecting magnetic signals is fed in a direction nearly parallel to the planes of layers constituting the GMR element, or may be of a CPP (current-perpendicular-to-plane) type wherein a current used for detecting magnetic signals is fed in a direction nearly perpendicular to the planes of the layers constituting the GMR element.

The magnetic head further includes a nonmagnetic layer 81 and a second top shield layer 82 that are disposed in this order on the first top shield layer 7. The nonmagnetic layer 81 is made of a nonmagnetic material such as alumina. The second top shield layer 82 is made of a magnetic material. The portion from the bottom shield layer 3 to the second top shield layer 82 makes up a read head.

The magnetic head further includes: an insulating layer 83 made of an insulating material and disposed on the second top shield layer 82; a coil 9 disposed on the insulating layer 83; an insulating layer 10 made of an insulating material and disposed around the coil 9 and in the space between the respective adjacent turns of the coil 9; and an insulating layer 11 made of an insulating material and disposed around the insulating layer 10. The coil 9 is planar spiral-shaped. The coil 9 and the insulating layers 10 and 11 have flattened top surfaces. The insulating layers 83 and 11 are made of alumina, for example. The insulating layer 10 is made of photoresist, for example. The coil 9 is made of a conductive material such as copper.

The magnetic head further includes a pole-layer-encasing layer 12 made of a nonmagnetic material and disposed on the flattened top surfaces of the coil 9 and the insulating layers 10 and 11. The pole-layer-encasing layer 12 has a top surface, and a groove 12a that opens at this top surface and that accommodates at least part of a pole layer described later. The pole-layer-encasing layer 12 may be made of an insulating material such as alumina, silicon oxide ($SiO_x$) or silicon oxynitride (SiON), or a nonmagnetic metal material such as Ru, Ta, Mo, Ti, W, NiCu, NiB or NiP.

The magnetic head further includes a nonmagnetic metal layer 13 made of a nonmagnetic metal material and disposed on the top surface of the pole-layer-encasing layer 12. The nonmagnetic metal layer 13 has a penetrating opening 13a, and the edge of this opening 13a is located directly above the edge of the groove 12a at the top surface of the pole-layer-encasing layer 12. The nonmagnetic metal layer 13 can be made of any of Ta, Mo, W, Ti, Ru, Rh, Re, Pt, Pd, Ir, NiCr, NiP, NiB, $WSi_2$, $TaSi_2$, $TiSi_2$, TiN, and TiW, for example.

The magnetic head further includes a nonmagnetic film 14, a nonmagnetic layer 15 and the pole layer 16 that are disposed in the groove 12a of the pole-layer-encasing layer 12 and in the opening 13a of the nonmagnetic metal layer 13. The nonmagnetic film 14 is disposed to touch the surface of the groove 12a. The pole layer 16 is disposed apart from the surface of the groove 12a. The nonmagnetic layer 15 is disposed between the nonmagnetic film 14 and the pole layer 16. The nonmagnetic layer 15 also functions as a seed layer used for forming the pole layer 16.

The nonmagnetic film 14 is made of a nonmagnetic material. The material used for the nonmagnetic film 14 may be an insulating material or a semiconductor material, for example. The insulating material as the material of the nonmagnetic film 14 may be any of alumina, silicon oxide ($SiO_x$) and silicon oxynitride (SiON), for example. The semiconductor material as the material of the nonmagnetic film 14 may be polycrystalline silicon or amorphous silicon, for example.

The nonmagnetic layer 15 is made of a nonmagnetic metal material. For example, the nonmagnetic layer 15 may be made of the same material as the nonmagnetic metal layer 13. The nonmagnetic layer 15 is disposed in the groove 12a and forms a pole-layer-encasing section 15a that accommodates the pole layer 16. The nonmagnetic layer 15 corresponds to the "nonmagnetic layer" of the present invention. The pole layer 16 will be described in detail later.

The magnetic head further includes a nonmagnetic layer 17 made of a nonmagnetic material and disposed on part of the top surface of the pole layer 16. The nonmagnetic layer 17 may include a layer made of an inorganic insulating material, or may include a layer made of a metal material. In the example illustrated in FIG. 1, the nonmagnetic layer 17 includes a first layer 171 that is made of a metal material and disposed on part of the top surface of the pole layer 16, and a second layer 172 that is made of an inorganic insulating material and disposed on the first layer 171. The metal material used to form the first layer 171 may be Ru, NiCr or NiCu, for example. The inorganic insulating material used to form the second layer 172 may be $Al_2O_3$ or silicon oxide, for example.

The magnetic head further includes a gap layer 18 disposed on the nonmagnetic metal layer 13, the nonmagnetic film 14, the nonmagnetic layer 15, the pole layer 16 and the nonmagnetic layer 17. A portion of the top surface of the pole layer 16 away from the medium facing surface 30 is not covered with the nonmagnetic layer 17 and the gap layer 18. The gap layer 18 may be made of an insulating material such as alumina or a nonmagnetic metal material such as Ru, NiCu, Ta, W, NiB or NiP.

The magnetic head further includes a shield 20. The shield 20 includes: a first layer 20A disposed on the gap layer 18; a yoke layer 20B disposed on part of the top surface of the pole layer 16 away from the medium facing surface 30; and a second layer 20C that couples the first layer 20A and the yoke layer 20B to each other. Each of the first layer 20A and the second layer 20C has an end face located in the medium facing surface 30. The first layer 20A, the yoke layer 20B and the second layer 20C are each made of a magnetic material. These layers 20A to 20C may be made of any of CoFeN, CoNiFe, NiFe and CoFe, for example.

The magnetic head further includes a nonmagnetic layer 21 made of a nonmagnetic material and disposed around the first layer 20A and the yoke layer 20B. The nonmagnetic layer 21 is made of an inorganic insulating material such as alumina or coating glass. Alternatively, the nonmagnetic layer 21 may be made up of a layer of a nonmagnetic metal material and a layer of an insulating material disposed thereon. In this case, the nonmagnetic metal material may be a refractory metal such as Ta, Mo, Nb, W, Cr, Ru, NiCu, Pd, or Hf, for example.

The magnetic head further includes: an insulating layer 22 disposed on regions of the top surfaces of the yoke layer 20B and the nonmagnetic layer 21 in which a coil 23 described later is disposed; the coil 23 disposed on the insulating layer 22; and an insulating layer 24 to cover the coil 23. The insulating layer 22 is made of alumina, for example. The coil 23 is planar spiral-shaped. Part of the coil 23 passes between the second layer 20C and the yoke layer 20B. The coil 23 is made of a conductive material such as copper. The insulating layer 24 is made of photoresist, for example. The magnetic head further includes a protection layer 25 made of an insulating material such as alumina and disposed to cover the second layer 20C. The portion from the coil 9 to the second layer 20C of the shield 20 makes up a write head.

As described so far, the magnetic head of the embodiment includes the medium facing surface 30 that faces toward the recording medium, the read head, and the write head. The read head and the write head are stacked on the substrate 1. The read head is disposed backward along the direction T of travel of the recording medium (that is, disposed closer to the air inflow end of the slider), while the write head is disposed forward along the direction T of travel of the recording medium (that is, disposed closer to the air outflow end of the slider).

The read head includes: the MR element 5 as the read element; the bottom shield layer 3 and the top shield layer 7 for shielding the MR element 5, the shield layers 3 and 7 having their respective portions that are located on a side of the medium facing surface 30 and that are opposed to each other with the MR element 5 located in between; the bottom shield gap film 4 disposed between the MR element 5 and the bottom shield layer 3; and the top shield gap film 6 disposed between the MR element 5 and the top shield layer 7.

The write head includes the coil 9, the pole-layer-encasing layer 12, the nonmagnetic metal layer 13, the nonmagnetic film 14, the nonmagnetic layer 15, the pole layer 16, the nonmagnetic layer 17, the gap layer 18, the shield 20, and the coil 23. The coils 9 and 23 generate a magnetic field corresponding to data to be written on the recording medium. The coil 9 is not an essential component of the write head and may be dispensed with. The nonmagnetic film 14 may also be dispensed with.

The pole layer 16 has an end face located in the medium facing surface 30, allows a magnetic flux corresponding to the magnetic field generated by the coil 23 to pass therethrough, and generates a write magnetic field for writing the data on the recording medium by means of the perpendicular magnetic recording system.

The shield 20 has an end face located in the medium facing surface 30, and is coupled to a portion of the pole layer 16 away from the medium facing surface 30. The pole layer 16 is located closer to the substrate 1 than is the shield 20. The gap layer 18 is made of a nonmagnetic material, has an end face located in the medium facing surface 30, and is provided between the pole layer 16 and the shield 20.

In the medium facing surface 30, the end face of the shield 20 is disposed forward of the end face of the pole layer 16 along the direction T of travel of the recording medium, with a predetermined distance provided therebetween by the thickness of the gap layer 18. The thickness of the gap layer 18 is within a range of 20 to 50 nm, for example. The coil 23 includes a portion that passes through the space surrounded by the pole layer 16 and the shield 20.

The pole layer 16 is disposed in the groove 12a of the pole-layer-encasing layer 12 and in the opening 13a of the nonmagnetic metal layer 13, with the nonmagnetic film 14 and the nonmagnetic layer 15 disposed between the pole layer 16 and each of the groove 12a and the opening 13a. The nonmagnetic film 14 has a thickness within a range of 20 to 80 nm, for example. However, the thickness of the nonmagnetic film 14 is not limited to this range but can be freely chosen depending on the track width. The nonmagnetic layer 15 has a thickness within a range of 20 to 80 nm, for example.

The shield 20 includes the first layer 20A disposed adjacent to the gap layer 18, the yoke layer 20B disposed on part of the top surface of the pole layer 16 away from the medium facing surface 30, and the second layer 20C that couples the first layer 20A and the yoke layer 20B to each other. The second layer 20C includes a portion located on a side of part of the coil 23 covered with the insulating layer 24 farther from the pole layer 16.

Figure 3:
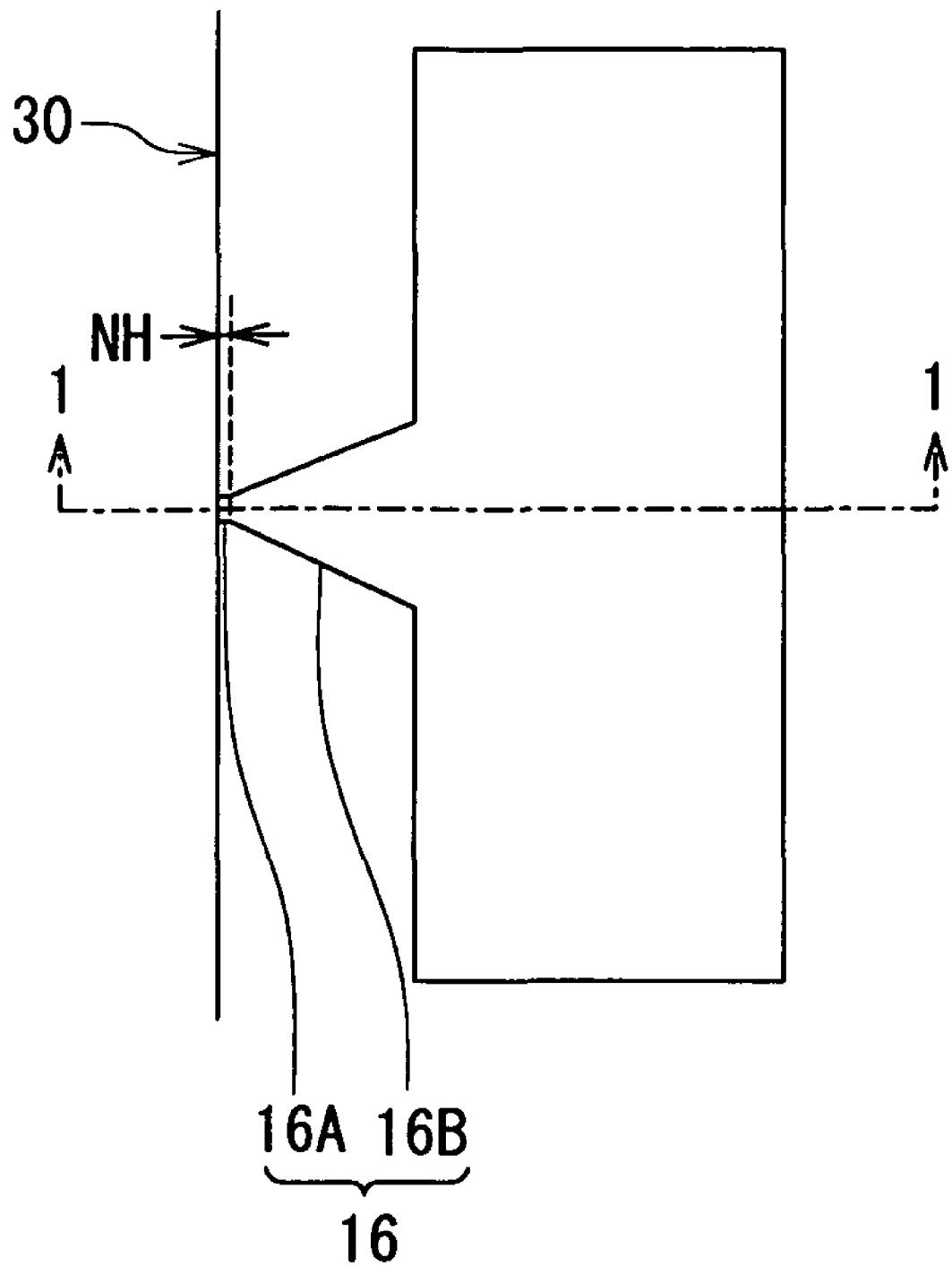
FIG. 3 is a top view of the pole layer of the magnetic head of the first embodiment of the invention.

A detailed description will now be given of the pole layer 16. FIG. 3 is a top view of the pole layer 16. In FIG. 3 line 1-1 indicates the position of the cross section of FIG. 1. As illustrated in FIG. 3, the pole layer 16 has: a track width defining portion 16A that defines the track width, the track width defining portion 16A including a first end located in the medium facing surface 30 and a second end opposite to the first end; and a wide portion 16B coupled to the second end of the track width defining portion 16A and having a width greater than that of the track width defining portion 16A. The track width defining portion 16A has a width that does not change in accordance with the distance from the medium facing surface 30. For example, the wide portion 16B is equal in width to the track width defining portion 16A at the boundary with the track width defining portion 16A, and gradually increases in width as the distance from the medium facing surface 30 increases and then maintains a specific width to the end of the wide portion 16B. In the embodiment, the track width defining portion 16A is a portion of the pole layer 16 from the end face located in the medium facing surface 30 to the point at which the width of the pole layer 16 starts to increase. Here, the length of the track width defining portion 16A taken in the direction perpendicular to the medium facing surface 30 is called a neck height NH. The neck height NH is within a range of 0.1 to 0.3 µm, for example.

In the embodiment, a difference in level is formed at the bottom of the groove 12a of the pole-layer-encasing layer 12 so that a portion of this bottom corresponding to the track width defining portion 16A is located farther from the substrate 1 than is a portion of the bottom corresponding to the wide portion 16B. Correspondingly, a difference in level is formed at the bottom surface of the pole layer 16 so that the bottom surface of the track width defining portion 16A is located farther from the substrate 1 than is the bottom surface of the wide portion 16B.

As illustrated in FIG. 2, the end face of the pole layer 16 located in the medium facing surface 30 has: a first side A1 closest to the substrate 1; a second side A2 opposite to the first side A1; a third side A3 connecting an end of the first side A1 and an end of the second side A2 to each other; and a fourth side A4 connecting the other end of the first side A1 and the other end of the second side A2 to each other. The second side A2 defines the track width. The width of the end face of the pole layer 16 located in the medium facing surface 30 decreases with decreasing distance from the first side A1. In other words, the width of the end face of the pole layer 16 located in the medium facing surface 30 decreases with increasing distance from the top surface of the pole-layer-encasing layer 12. Each of the third side A3 and the fourth side A4 forms an angle within a range of 5 to 15 degrees, for example, with respect to the direction perpendicular to the top surface of the substrate 1. The length of the second side A2, that is, the track width, is within a range of 0.05 to 0.20 µm, for example.

Furthermore, as illustrated in FIG. 1, the top surface of the pole layer 16 includes: a first portion 16T1 having a first edge located in the medium facing surface 30 and a second edge opposite thereto; and a second portion 16T2 located farther from the medium facing surface 30 than is the first portion 16T1 and connected to the first portion 16T1 at the second edge. The first edge coincides with the second side A2. The distance from the substrate 1 to any point on the first portion 16T1 increases with increasing distance from the point to the medium facing surface 30. The second portion 16T2 extends in a direction substantially perpendicular to the medium facing surface 30.

The nonmagnetic layer 17 is disposed on the second portion 16T2. The nonmagnetic layer 17 has a bottom surface touching the second portion 16T2, and this bottom surface has an edge located at the second edge. In the example illustrated in FIG. 1, the nonmagnetic layer 17 includes the first layer 171 made of a metal material and disposed on part of the top surface of the pole layer 16, and the second layer 172 made of an inorganic insulating material and disposed on the first layer 171. The nonmagnetic layer 17 may consist of a single layer made of a metal material, or a single layer made of an inorganic insulating material.

The gap layer 18 is disposed to cover the first portion 16T1 of the top surface of the pole layer 16 and the nonmagnetic layer 17.

The first layer 20A of the shield 20 has a bottom surface touching the gap layer 18. The bottom surface of the first layer 20A bends to be opposed to the pole layer 16 and the nonmagnetic layer 17 with the gap layer 18 in between. The distance between the bottom surface of the first layer 20A and the second portion 16T2 is greater than the distance between the bottom surface of the first layer 20A and the first portion 16T1.

In the embodiment, throat height TH is equal to the distance between the medium facing surface 30 and the edge of the bottom surface of the nonmagnetic layer 17 closest to the medium facing surface 30. The throat height TH is within the range of 0.08 to 0.12 µm, for example.

The pole layer 16 includes a plurality of magnetic films stacked. Here, by way of example, the pole layer 16 includes five magnetic films 161, 162, 163, 164 and 165 stacked. At least one of the plurality of magnetic films 161 to 165 includes: a first portion included in the track width defining portion 16A, the first portion having a first thickness in a cross section passing through the center of the pole layer 16 taken in the track width direction; a second portion included in the wide portion 16B, the second portion having a second thickness in the cross section passing through the center of the pole layer 16 taken in the track width direction, the second thickness being smaller than the first thickness; and a third portion that couples the first portion and the second portion to each other. In the cross section passing through the center of the pole layer 16 taken in the track width direction, the top surface of the third portion is inclined with respect to the direction perpendicular to the medium facing surface 30.

FIG. 1 shows the cross section passing through the center of the pole layer 16 taken in the track width direction. Here, by way of example, FIG. 1 shows that the magnetic film 161 includes a first portion 161A, a second portion 161B and a third portion 161C, while the magnetic film 162 includes a first portion 162A, a second portion 162B and a third portion 162C.

In the magnetic film 161, the first portion 161A is the portion included in the track width defining portion 16A and having the first thickness t11 in the cross section of FIG. 1; the second portion 161B is the portion included in the wide portion 16B and having the second thickness t12 smaller than the first thickness t11 in the cross section of FIG. 1; and the third portion 161C is the portion that couples the first portion 161A and the second portion 161B to each other. In the cross section of FIG. 1, the top surface of the third portion 161C is inclined with respect to the direction perpendicular to the medium facing surface 30. To be specific, in the cross section of FIG. 1, the distance from the substrate 1 to any point on the top surface of the third portion 161C decreases with increasing distance from the point to the medium facing surface 30.

Likewise, in the magnetic film 162, the first portion 162A is the portion included in the track width defining portion 16A and having the first thickness t21 in the cross section of FIG. 1; the second portion 162B is the portion included in the wide portion 16B and having the second thickness t22 smaller than the first thickness t21 in the cross section of FIG. 1; and the third portion 162C is the portion that couples the first portion 162A and the second portion 162B to each other. In the cross section of FIG. 1, the top surface of the third portion 162C is inclined with respect to the direction perpendicular to the medium facing surface 30. To be specific, in the cross section of FIG. 1, the distance from the substrate 1 to any point on the top surface of the third portion 162C decreases with increasing distance from the point to the medium facing surface 30.

In the embodiment, of the plurality of magnetic films 161 to 165 constituting the pole layer 16, the magnetic film 165 located uppermost may have a saturation flux density different from that of each of the other magnetic films 161 to 164. Each of the magnetic films 161 to 164 is, for example, made of CoFe and formed by physical vapor deposition. In this case, the magnetic films 161 to 164 each have a saturation flux density of approximately 2.4 T, for example. On the other hand, the magnetic film 165 is made of CoFe or FeNi and formed by plating, for example. In the case where the magnetic film 165 is made of CoFe and formed by plating, the saturation flux density of the magnetic film 165 is approximately 2.3 T, for example. In the case where the magnetic film 165 is made of FeNi and formed by plating, the saturation flux density of the magnetic film 165 is approximately 2.1 T, for example.

Reference is now made to FIG. 4A to FIG. 16A and FIG. 4B to FIG. 16B to describe a method of manufacturing the magnetic head of the embodiment. FIG. 4A to FIG. 16A each illustrate a cross section of a stack of layers formed in the course of manufacturing the magnetic head, the cross section being perpendicular to the medium facing surface and the top surface of the substrate. FIG. 4B to FIG. 16B each illustrate a cross section of the stack of layers taken at the position at which the medium facing surface is to be formed. The portions closer to the substrate 1 than the pole-layer-encasing layer 12 are omitted in FIG. 4A to FIG. 16A and FIG. 4B to FIG. 16B.

In the method of manufacturing the magnetic head of the embodiment, first, as illustrated in FIG. 1, the insulating layer 2, the bottom shield layer 3 and the bottom shield gap film 4 are formed in this order on the substrate 1. Next, the MR element 5 and leads (not shown) connected to the MR element 5 are formed on the bottom shield gap film 4. Next, the MR element 5 and the leads are covered with the top shield gap film 6. Next, the top shield layer 7, the nonmagnetic layer 81, the second top shield layer 82 and the insulating layer 83 are formed in this order on the top shield gap film 6. Next, the coil 9 and the insulating layers 10 and 11 are formed on the insulating layer 83. Next, the top surfaces of the coil 9 and the insulating layers 10 and 11 are flattened by CMP, for example.

Figures 4A, 4B:
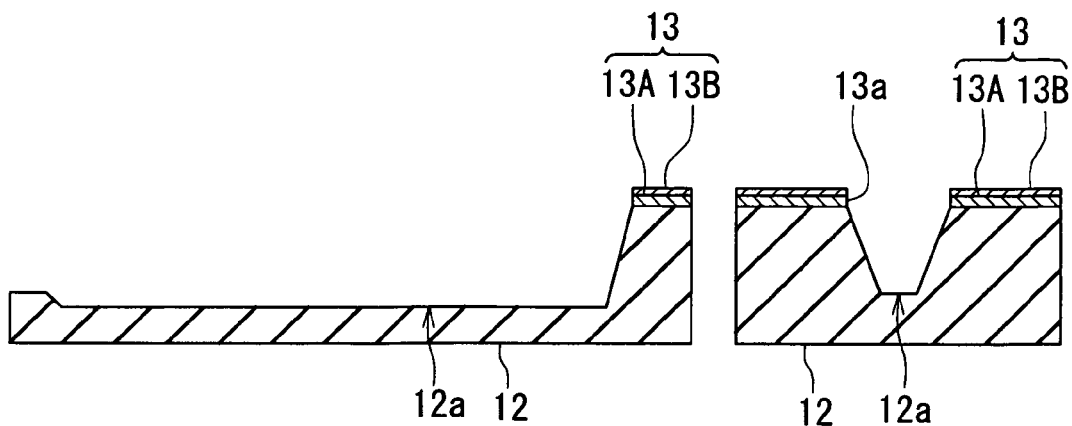
FIG. 4A and FIG. 4B are views illustrating a step of a method of manufacturing the magnetic head of the first embodiment of the invention.

FIG. 4A and FIG. 4B illustrate the next step. In this step, first, a nonmagnetic layer that is to become the pole-layer-encasing layer 12 later by undergoing formation of the groove 12a therein is formed on the flattened top surfaces of the coil 9 and the insulating layers 10 and 11. Next, on this nonmagnetic layer, the nonmagnetic metal layer 13 made of a nonmagnetic metal material is formed by sputtering, for example. The nonmagnetic metal layer 13 has a thickness within a range of 20 to 100 nm, for example. Here is given an example in which the nonmagnetic metal layer 13 consists of a first layer 13A and a second layer 13B stacked on the first layer 13A, wherein the first layer 13A is made of Ru and 40 nm thick, while the second layer 13B is made of Cr and 20 nm thick.

Next, a photoresist layer (not shown) having a thickness of 1.0 μm, for example, is formed on the nonmagnetic metal layer 13. Next, this photoresist layer is patterned to form a mask to be used for forming the groove 12a of the pole-layer-encasing layer 12. The mask has an opening having a shape corresponding to the groove 12a. Next, the nonmagnetic metal layer 13 is selectively etched using the mask. As a result, the penetrating opening 13a is formed in the nonmagnetic metal layer 13. The opening 13a has a shape corresponding to the plane geometry of the pole layer 16 to be formed later. Furthermore, in the nonmagnetic layer to become the pole-layer-encasing layer 12, the portion exposed from the opening 13a of the nonmagnetic metal layer 13 is selectively etched to thereby form the groove 12a in the nonmagnetic layer. The mask is then removed. As a result of the formation of the groove 12a, the nonmagnetic layer becomes the pole-layer-encasing layer 12. The edge of the opening 13a of the nonmagnetic metal layer 13 is located directly above the edge of the groove 12a located at the top surface of the pole-layer-encasing layer 12.

The groove 12a of the pole-layer-encasing layer 12 has two walls located on opposite sides in the track width direction, and the two walls are each inclined at a first angle with respect to the direction perpendicular to the top surface of the substrate 1 so that the distance between the two walls decreases with decreasing distance from the top surface of the substrate 1.

The etching of each of the nonmagnetic metal layer 13 and the nonmagnetic layer is performed by reactive ion etching (hereinafter referred to as RIE) or ion beam etching (hereinafter referred to as IBE), for example. The etching for forming the groove 12a in the nonmagnetic layer is performed such that the walls of the groove 12a corresponding to both side portions of the track width defining portion 16A of the pole layer 16 each form an angle within a range of 5 to 15 degrees, for example, with respect to the direction perpendicular to the top surface of the substrate 1.

Figures 5A, 5B:
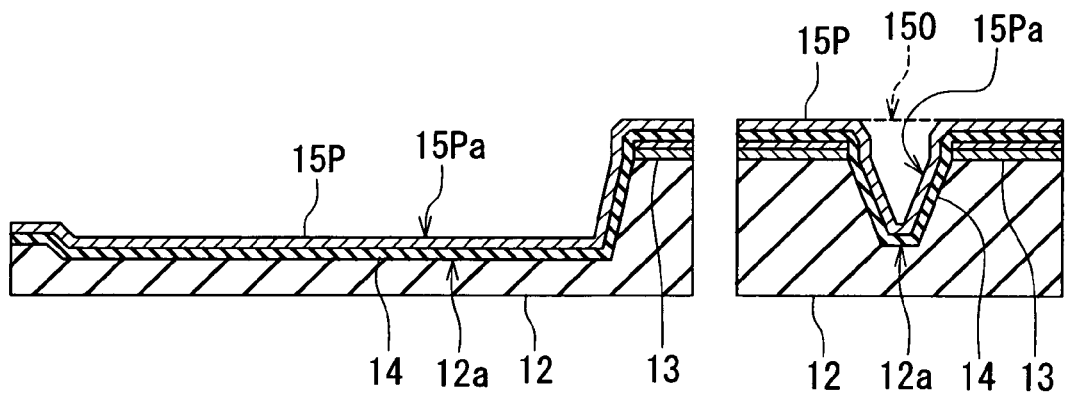
FIG. 5A and FIG. 5B are views illustrating a step that follows the step of FIG. 4A and FIG. 4B.

FIG. 5A and FIG. 5B illustrate the next step. In this step, first, the nonmagnetic film 14 is formed on the entire top surface of the stack of layers. The nonmagnetic film 14 is formed also in the groove 12a of the pole-layer-encasing layer 12. The nonmagnetic film 14 is formed by sputtering or chemical vapor deposition (hereinafter referred to as CVD), for example. The thickness of the nonmagnetic film 14 is precisely controllable. In the case of forming the nonmagnetic film 14 by CVD, it is preferred to employ, in particular, so-called atomic layer CVD (hereinafter referred to as ALCVD) in which formation of a single atomic layer is repeated. In this case, it is possible to control the thickness of the nonmagnetic film 14 with higher precision. In the case of forming the nonmagnetic film 14 by ALCVD, it is preferable to use alumina, in particular, as the material of the nonmagnetic film 14. In the case of using a semiconductor material to form the nonmagnetic film 14, it is preferred that the nonmagnetic film 14 be formed by ALCVD at low temperatures (around 200° C.) or by low-pressure CVD at low temperatures. The semiconductor material to be used as the material of the nonmagnetic film 14 is preferably undoped polycrystalline silicon or amorphous silicon.

Next, an initial nonmagnetic layer 15P is formed on the entire top surface of the stack of layers by physical vapor deposition, the initial nonmagnetic layer 15P being intended to become the nonmagnetic layer 15 later by undergoing etching of the surface thereof. The initial nonmagnetic layer 15P is formed in the groove 12a of the pole-layer-encasing layer 12 and above the top surface of the pole-layer-encasing layer 12. Here, by way of example, the initial nonmagnetic layer 15P is made of Ru and formed to have a thickness of 60 nm by ion beam deposition (hereinafter referred to as IBD) as a type of physical vapor deposition. The initial nonmagnetic layer 15P forms an initial encasing section 15Pa that is to become a pole-layer-encasing section 15a later. The initial encasing section 15Pa has an opening 150.

Figures 6A, 6B:
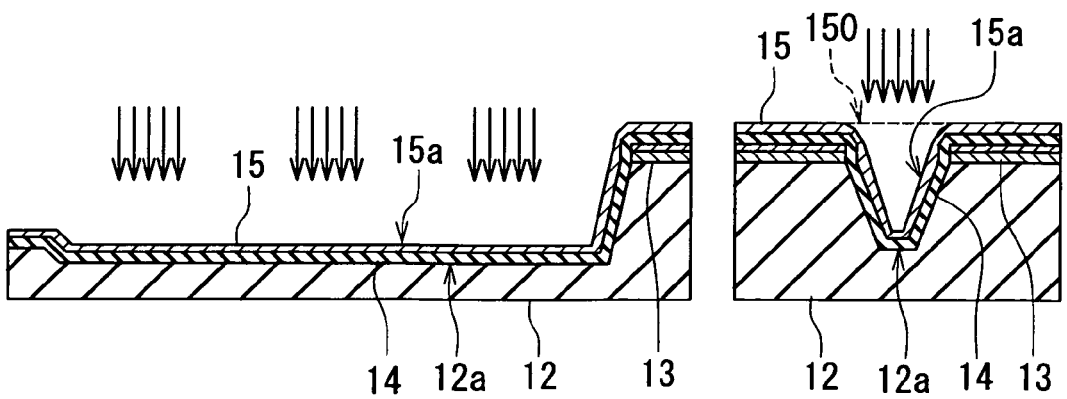
FIG. 6A and FIG. 6B are views illustrating a step that follows the step of FIG. 5A and FIG. 5B.

FIG. 6A and FIG. 6B illustrate the next step. In this step, the surface of the initial nonmagnetic layer 15P is etched by dry etching so that the initial nonmagnetic layer 15P becomes the nonmagnetic layer 15. Here, by way of example, IBE is employed to etch the surface of the initial nonmagnetic layer 15P. In this case, the etching is performed such that the direction of travel of ion beams forms an angle within a range of 0 degree to 15 degrees with respect to the direction perpendicular to the top surface of the substrate 1, and that the direction of travel of the ion beams rotates as seen in the direction perpendicular to the top surface of the substrate 1 when the foregoing angle is other than 0 degree.

As a result of this etching, the opening 150 becomes wider than before the etching, and the initial encasing section 15Pa thereby becomes the pole-layer-encasing section 15a. Furthermore, as a result of the etching, the thickness of a portion of the nonmagnetic layer 15 near the opening 150 becomes smaller than the thickness of the other portion of the nonmagnetic layer 15. Furthermore, as a result of the etching, the surface of the initial nonmagnetic layer 15P is smoothed, whereby a smoothed surface of the nonmagnetic layer 15 is formed. This will be described in detail later. The nonmagnetic layer 15 indicates a level at which polishing is stopped in a polishing step to be performed later.

FIG. 7A and FIG. 7B illustrate the next step. In this step, an initial magnetic film 161P is formed on the nonmagnetic layer 15 by physical vapor deposition, the initial magnetic film 161P being intended to become the magnetic film 161 later by undergoing etching of the surface thereof. The initial magnetic film 161P is formed in the pole-layer-encasing section 15a and above the top surface of the pole-layer-encasing layer 12. Here, by way of example, the initial magnetic film 161P is made of CoFe and formed by IBD or sputtering, as a type of physical vapor deposition. The thickness of the initial magnetic film 161P is within a range of 30 to 60 nm, for example. The initial magnetic film 161P forms a groove corresponding to the groove 12a. The groove has an opening.

FIG. 8A and FIG. 8B illustrate the next step. In this step, the surface of the initial magnetic film 161P is etched by dry etching so that the initial magnetic film 161P becomes the magnetic film 161. Here, by way of example, IBE is employed to etch the surface of the initial magnetic film 161P. This step is performed by ion beam etching such that the direction of travel of ion beams forms a second angle with respect to the direction perpendicular to the top surface of the substrate 1, the second angle being greater than the first angle (the angle formed by each of the two walls of the groove 12a of the pole-layer-encasing layer 12 with respect to the direction perpendicular to the top surface of the substrate 1). More specifically, in this step, the etching is performed such that the direction of travel of the ion beams forms an angle within a range of 40 to 50 degrees with respect to the direction perpendicular to the top surface of the substrate 1, and that the direction of travel of the ion beams rotates as seen in the direction perpendicular to the top surface of the substrate 1.

As a result of this etching, the opening of the groove formed by the initial magnetic film 161P becomes wider than before the etching, and the initial magnetic film 161P thereby becomes the magnetic film 161. Furthermore, as a result of the etching, the surface of the initial magnetic film 161P is smoothed, whereby a smoothed surface of the magnetic film 161 is formed.

FIG. 9A and FIG. 9B illustrate the next step. In this step, an initial magnetic film 162P is formed on the magnetic film 161 by physical vapor deposition, the initial magnetic film 162P being intended to become the magnetic film 162 later by undergoing etching of the surface thereof. The initial magnetic film 162P is formed in the pole-layer-encasing section 15a and above the top surface of the pole-layer-encasing layer 12. Here, by way of example, the initial magnetic film 162P is made of CoFe and formed by IBD or sputtering, as a type of physical vapor deposition. The thickness of the initial magnetic film 162P is within a range of 30 to 60 nm, for example. The initial magnetic film 162P forms a groove corresponding to the groove 12a. The groove has an opening.

Next, although not shown, the surface of the initial magnetic film 162P is etched in the same way as the etching of the surface of the initial magnetic film 161P. As a result of this etching, the opening of the groove formed by the initial magnetic film 162P becomes wider than before the etching, and the initial magnetic film 162P thereby becomes the magnetic film 162. Furthermore, as a result of the etching, the surface of the initial magnetic film 162P is smoothed, whereby a smoothed surface of the magnetic film 162 is formed.

Next, in the same way as the formation of the magnetic film 162, the magnetic films 163 and 164 are formed one by one on the magnetic film 162. Specifically, first, an initial magnetic film that is to become the magnetic film 163 later by undergoing etching of the surface thereof is formed on the magnetic film 162 by physical vapor deposition, and then the surface of the initial magnetic film is etched by dry etching to thereby form the magnetic film 163. Next, an initial magnetic film that is to become the magnetic film 164 later by undergoing etching of the surface thereof is formed on the magnetic film 163 by physical vapor deposition, and then the surface of the initial magnetic film is etched by dry etching to thereby form the magnetic film 164.

Figure 10A:
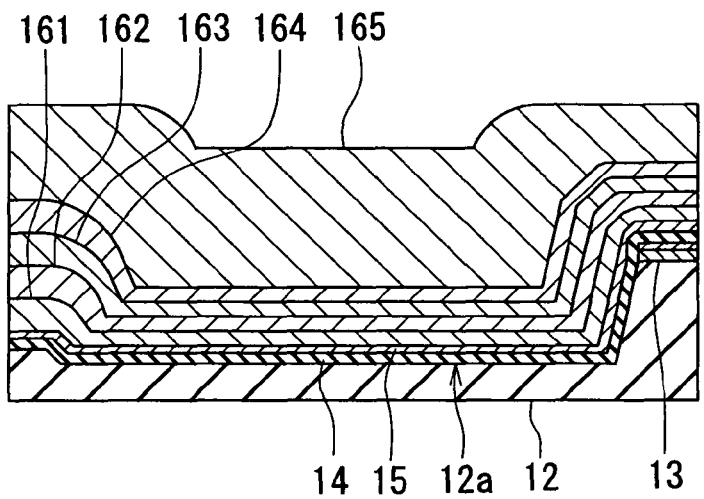
FIG. 10A and FIG. 10B are views illustrating a step that follows the step of FIG. 9A and FIG. 9B.
Figure 10B:
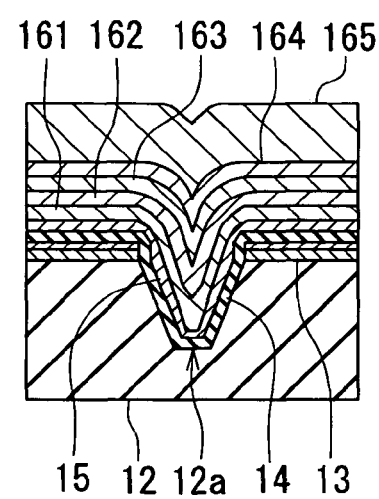

FIG. 10A and FIG. 10B illustrate the next step. In this step, the magnetic film 165 is formed on the magnetic film 164 by plating, for example. Alternatively, the magnetic film 165 may be formed by physical vapor deposition instead of plating.

Figure 11A:
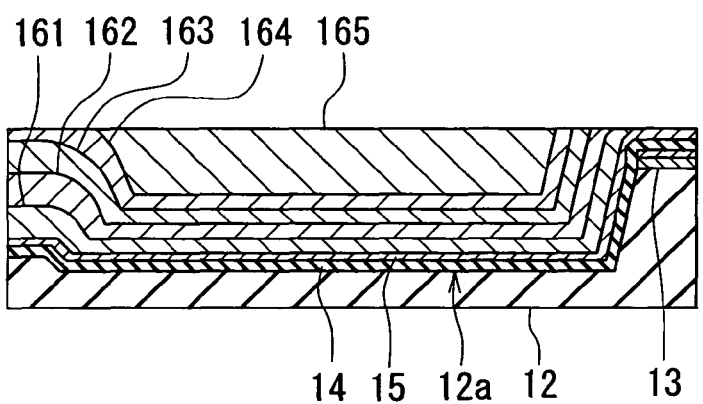
FIG. 11A and FIG. 11B are views illustrating a step that follows the step of FIG. 10A and FIG. 10B.
Figure 11B:
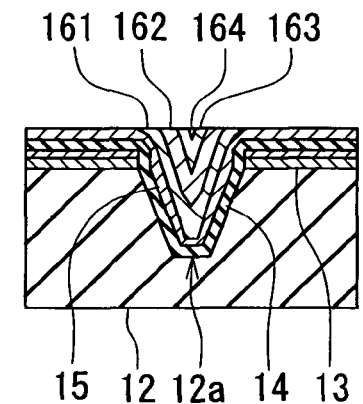

FIG. 11A and FIG. 11B illustrate the next step. In this step, first, a coating layer (not shown) made of alumina, for example, is formed to have a thickness of 0.5 to 1.2 µm, for example, on the entire top surface of the stack of layers. Next, the coating layer and the magnetic films 161 to 165 are polished by CMP, for example, until the nonmagnetic layer 15 is exposed, and the top surfaces of the nonmagnetic layer 15 and the magnetic films 161 to 165 are thereby flattened. In the case of polishing the coating layer and the magnetic films 161 to 165 by CMP, such a slurry is used that polishing is stopped when the nonmagnetic layer 15 is exposed, such as an alumina-base slurry.

Figures 12A, 12B:
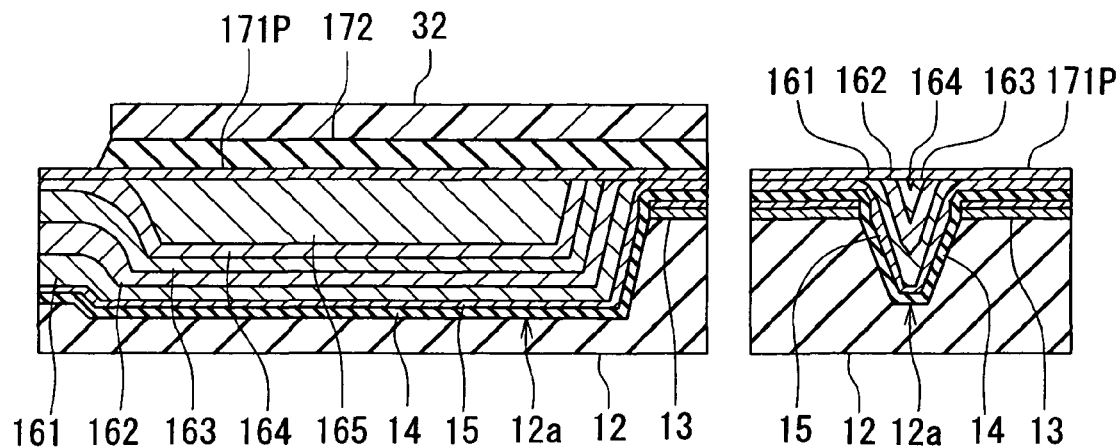
FIG. 12A and FIG. 12B are views illustrating a step that follows the step of FIG. 11A and FIG. 11B.

FIG. 12A and FIG. 12B illustrate the next step. In this step, first, a first film 171P is formed by sputtering, for example, on the entire top surface of the stack of layers, the first film 171P being intended to become the first layer 171 of the nonmagnetic layer 17 later by undergoing partial etching. Next, a second film is formed on the first film 171P by sputtering, for example, the second film being intended to become the second layer 172 of the nonmagnetic layer 17 later by undergoing partial etching. Next, a photoresist layer having a thickness of 1.0 µm, for example, is formed on the second film. This photoresist layer is then patterned to form a mask 32 to be used for patterning the second film. Next, the second film is partially etched by RIE, for example, using the mask 32. As illustrated in FIG. 12A, the etching of the second film is performed such that the bottom of the groove formed by the etching reaches the top surface of the first film 171P and the etching is stopped at that level. Therefore, a material whose etching rate is lower than that of the second film when the second film is partially etched is selected as the material to form the first film 171P. Specifically, for example, Ru, NiCr or NiCu is used as the material of the first film 171P, while $Al_2O_3$ or silicon oxide is used as the material of the second film. By being partially etched, the second film becomes the second layer 172. Next, the mask 32 is removed.

Figures 13A, 13B:
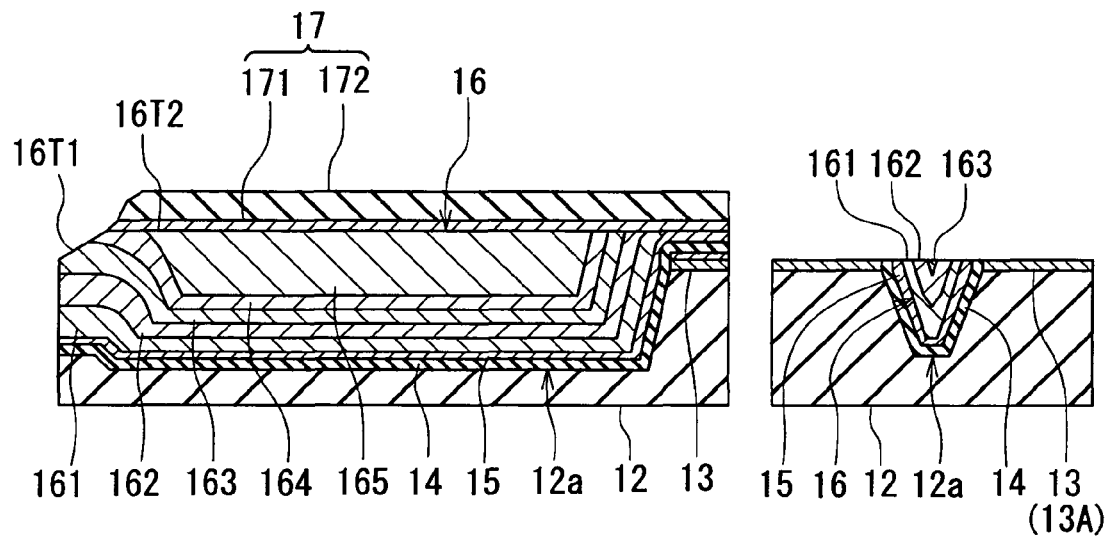
FIG. 13A and FIG. 13B are views illustrating a step that follows the step of FIG. 12A and FIG. 12B.

FIG. 13A and FIG. 13B illustrate the next step. In this step, first, the first film 171P is partially etched by IBE, for example, using the second layer 172 as a mask. As a result, the first film 171P becomes the first layer 171, whereby the nonmagnetic layer 17 having the first layer 171 and the second layer 172 is formed. Next, a stack of the magnetic films 161 to 165 is partially etched by IBE, for example, using the nonmagnetic layer 17 as a mask. The first portion 16T1 and the second portion 16T2 are thereby formed in the top surface of the stack of the magnetic films 161 to 165, whereby the pole layer 16 composed of the magnetic films 161 to 165 is formed.

Figure 14A:
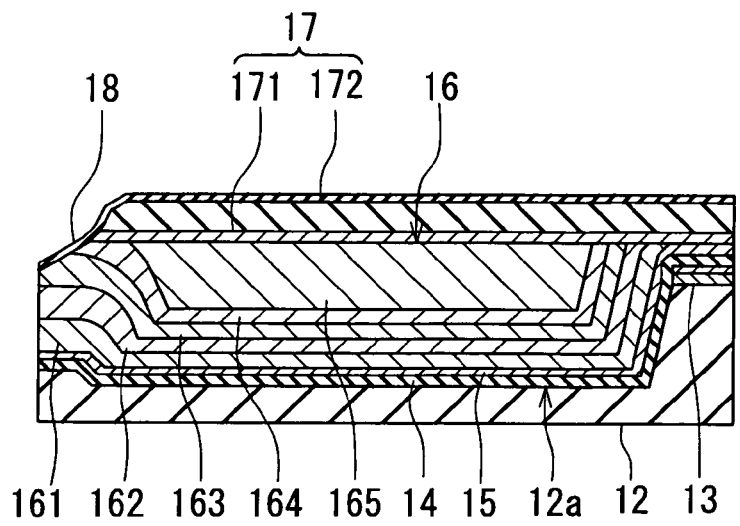
FIG. 14A and FIG. 14B are views illustrating a step that follows the step of FIG. 13A and FIG. 13B.
Figure 14B:
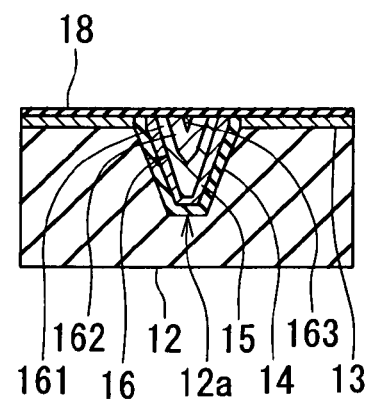

FIG. 14A and FIG. 14B illustrate the next step. In this step, first, the gap layer 18 is formed on the entire top surface of the stack of layers. The gap layer 18 is formed by sputtering or CVD, for example. In the case of forming the gap layer 18 by CVD, it is preferred to employ ALCVD, in particular. In the case of forming the gap layer 18 by ALCVD, it is preferred to use alumina, in particular, as the material of the gap layer 18. If formed by ALCVD, the gap layer 18 exhibits a good step coverage. Employing ALCVD to form the gap layer 18 thus allows the resultant gap layer 18 to be uniform on an uneven surface.

Figure 15A:
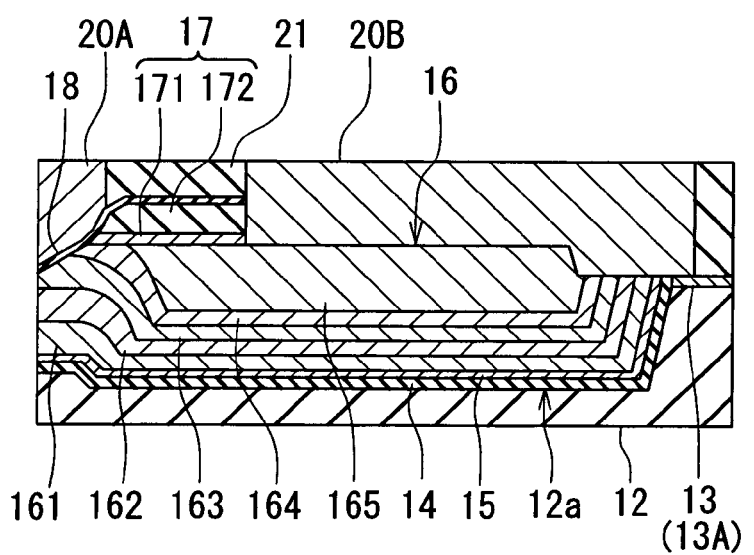
FIG. 15A and FIG. 15B are views illustrating a step that follows the step of FIG. 14A and FIG. 14B.
Figure 15B:
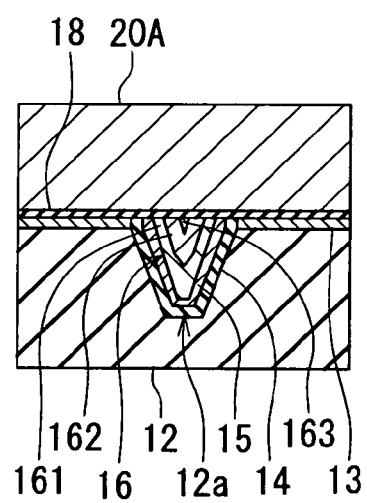

FIG. 15A and FIG. 15B illustrate the next step. In this step, the nonmagnetic layer 17 and the gap layer 18, except portions thereof located near the medium facing surface 30, are selectively etched by IBE, for example. Furthermore, in a region near an end of the groove 12*a* of the pole-layer-encasing layer 12 farther from the medium facing surface 30, the magnetic films 161 to 165, the nonmagnetic layer 15 and the nonmagnetic film 14 are etched by IBE, for example, until the first layer 13A of the nonmagnetic metal layer 13 is exposed.

Next, the first layer 20A is formed on the gap layer 18 and the yoke layer 20B is formed on a region of the pole layer 16 away from the medium facing surface. The first layer 20A and the yoke layer 20B may be formed by frame plating, or by making a magnetic layer through sputtering and then selectively etching this magnetic layer. Next, the nonmagnetic layer 21 is formed on the entire top surface of the stack of layers. Next, the nonmagnetic layer 21 is polished by CMP, for example, until the first layer 20A and the yoke layer 20B are exposed, and the top surfaces of the first layer 20A, the yoke layer 20B and the nonmagnetic layer 21 are thereby flattened.

Figures 16A, 16B:
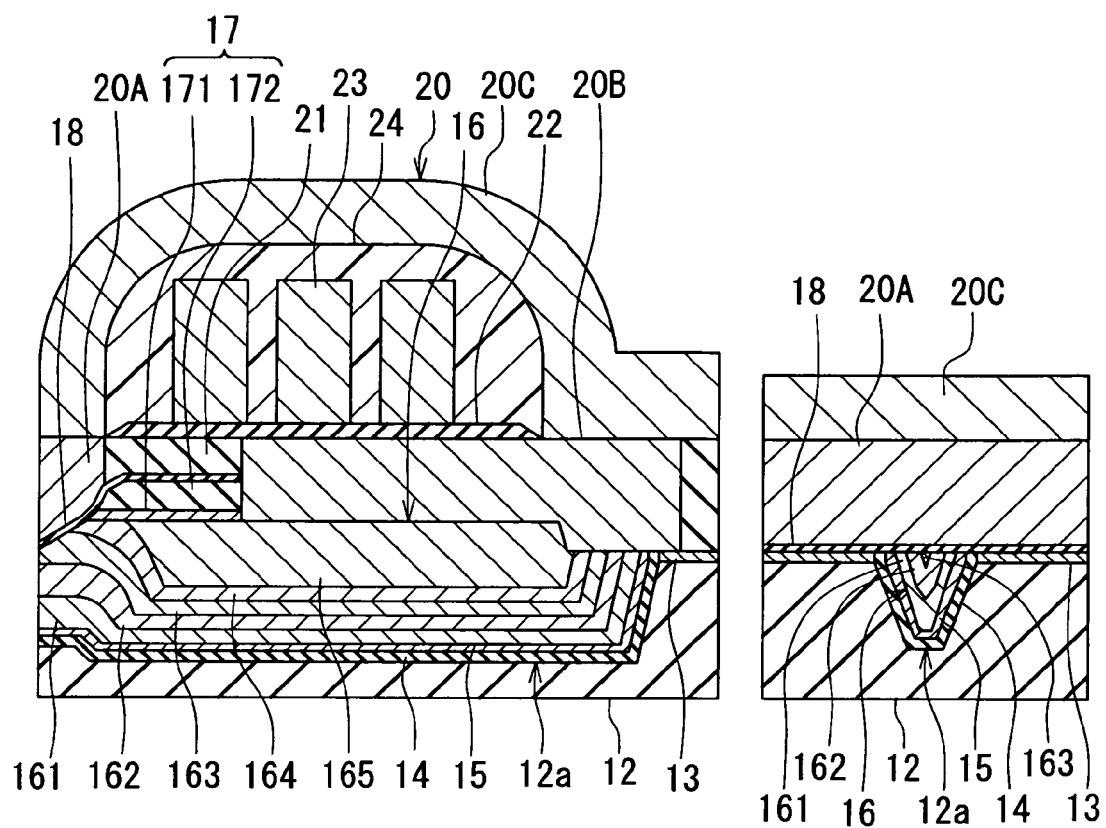
FIG. 16A and FIG. 16B are views illustrating a step that follows the step of FIG. 15A and FIG. 15B.

FIG. 16A and FIG. 16B illustrate the next step. In this step, first, the insulating layer 22 is formed on regions of the top surfaces of the yoke layer 20B and the nonmagnetic layer 21 where the coil 23 is to be disposed. Next, the coil 23 is formed by frame plating, for example, so that at least part of the coil 23 is disposed on the insulating layer 22. Next, the insulating layer 24 is formed to cover the coil 23. Next, the second layer 20C is formed by frame plating, for example, to complete the shield 20.

Next, as illustrated in FIG. 1, the protection layer 25 is formed to cover the entire top surface of the stack of layers. Wiring and terminals are then formed on the protection layer 25, the substrate 1 is cut at a position near the medium facing surface, the surface formed by this cutting is polished to form the medium facing surface 30, and a process such as fabrication of flying rails is performed to thereby complete the magnetic head.

The operation and effects of the magnetic head of the embodiment will now be described. In the magnetic head, the write head writes data on a recording medium while the read head reads data written on the recording medium. In the write head, the coil 23 generates a magnetic field corresponding to data to be written on the recording medium. The pole layer 16 and the shield 20 form a magnetic path that allows a magnetic flux corresponding to the magnetic field generated by the coil 23 to pass therethrough. The pole layer 16 allows the magnetic flux corresponding to the magnetic field generated by the coil 23 to pass and generates a write magnetic field used for writing the data on the recording medium by means of the perpendicular magnetic recording system. The shield layer 20 takes in a disturbance magnetic field applied from outside the magnetic head to the magnetic head. It is thereby possible to prevent erroneous writing on the recording medium caused by the disturbance magnetic field intensively taken into the pole layer 16.

According to the embodiment, in the medium facing surface 30, the end face of the shield 20 is located forward of the end face of the pole layer 16 along the direction T of travel of the recording medium (that is, located closer to the air outflow end of the slider) with a specific small distance provided therebetween by the gap layer 18. The position of an end of the bit pattern to be written on the recording medium is determined by the position of the end of the pole layer 16 that is closer to the gap layer 18 and located in the medium facing surface 30. The shield 20 takes in a magnetic flux generated from the end face of the pole layer 16 located in the medium facing surface 30 and expanding in directions except the direction perpendicular to the plane of the recording medium, and thereby prevents this magnetic flux from reaching the recording medium. It is thereby possible to prevent a direction of magnetization of the bit pattern already written on the recording medium from being changed due to the effect of the above-mentioned flux. As a result, according to the embodiment, it is possible to improve the linear recording density.

According to the embodiment, as illustrated in FIG. 2, the width of the end face of the pole layer 16 located in the medium facing surface 30 decreases with decreasing distance from the first side A1. This makes it possible to prevent the problems resulting from the skew.

In the embodiment, the top surface of the pole layer 16 includes: the first portion 16T1 having the first edge located in the medium facing surface 30 and the second edge opposite thereto; and the second portion 16T2 located farther from the medium facing surface 30 than is the first portion 16T1 and connected to the first portion 16T1 at the second edge. The first edge coincides with the second side A2 of the end face of the pole layer 16 that defines the track width. The distance from the substrate 1 to any point on the first portion 16T1 increases with increasing distance from the point to the medium facing surface 30. The angle of inclination of the first portion 16T1 taken at the position of the first edge with respect to the direction perpendicular to the medium facing surface 30 is greater than 0 degree. According to the embodiment, such a shape of the pole layer 16 makes it possible to prevent the problems resulting from the skew through the reduction in thickness of the pole layer 16 taken in the medium facing surface 30, and also makes it possible to introduce magnetic flux of great magnitude to the medium facing surface 30 through the pole layer 16. Consequently, it is possible to improve the write characteristics such as the overwrite property.

Furthermore, according to the embodiment, in the neighborhood of the medium facing surface 30, the cross-sectional area of the pole layer 16 perpendicular to the direction in which magnetic flux flows is greater as compared with a case where the thickness of the pole layer is uniform in a region from the medium facing surface 30 to a specific point as seen in the direction perpendicular to the medium facing surface 30. As a result, according to the embodiment, it is possible to allow magnetic flux of greater magnitude to pass through the pole layer 16 in the neighborhood of the medium facing surface 30. It is thereby possible to improve the write characteristics such as the overwrite property.

In the embodiment, the top surface of the pole layer 16 bends near the medium facing surface 30. This makes it possible to suppress formation of residual magnetization in the direction perpendicular to the medium facing surface 30 in a portion of the pole layer 16 near the medium facing surface 30 after a writing operation. As a result, according to the embodiment, it is possible to suppress the occurrence of the phenomenon in which data stored on the recording medium is erased due to residual magnetization in the pole layer 16 after a writing operation.

In the embodiment, the pole layer 16 is disposed in the groove 12a of the pole-layer-encasing layer 12 made of a nonmagnetic material, with the nonmagnetic film 14 and the nonmagnetic layer 15 disposed in between. Consequently, the width of the pole layer 16 is smaller than that of the groove 12a. This makes it easy to form the groove 12a and to reduce the width of the pole layer 16, or the width of the top surface of the track width defining portion 16A that defines the track width, in particular. Consequently, according to the embodiment, it is possible to easily provide a track width smaller than the minimum track width that can be formed by photolithography, and to control the track width with accuracy.

Figure 17:
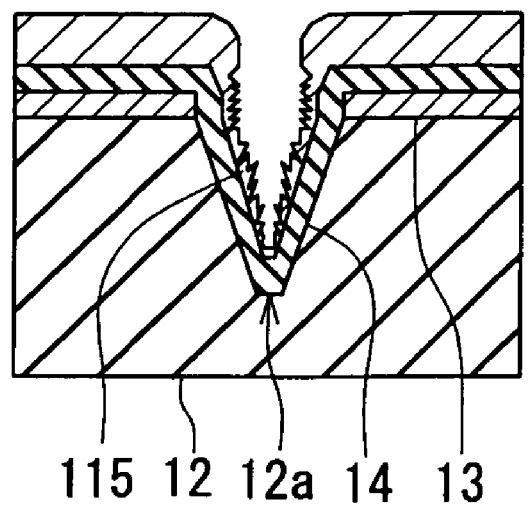
FIG. 17 is a view for explaining a method of forming a pole layer of a comparative example.

Descriptions will now be made on the advantageous effects of the method of forming the pole layer 16 of the embodiment and the advantageous effects of the structure of the pole layer 16 formed by this method. First, a method of forming a pole layer of a comparative example will be described with reference to FIG. 17 to FIG. 19. According to the method of forming the pole layer of the comparative example, first, as shown in FIG. 17, a seed layer 115 made of a nonmagnetic metal material such as Ru is formed by physical vapor deposition on the nonmagnetic film 14 in the groove 12a of the pole-layer-encasing layer 12. This seed layer 115 is similar to the initial nonmagnetic layer 15P formed in the step illustrated in FIG. 5A and FIG. 5B. The seed layer 115 forms a groove corresponding to the groove 12a. This groove has an opening. The surface of the seed layer 115 formed in the groove 12a is a rough surface on which a columnar crystal appears. According to the comparative example, the pole layer is formed by physical vapor deposition or plating in the groove formed by the seed layer 115.

Figure 18:
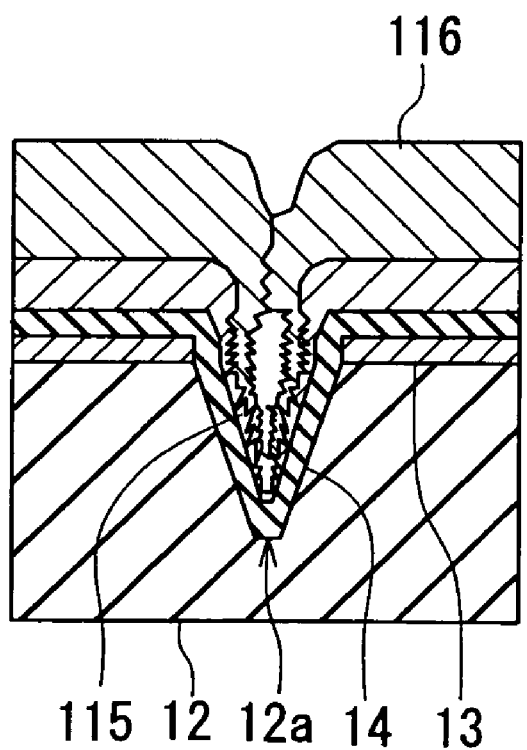
FIG. 18 is a view for explaining the method of forming the pole layer of the comparative example.

FIG. 18 illustrates a state where a magnetic film 116 to become the pole layer later has been formed by physical vapor deposition such as IBD in the groove formed by the seed layer 115. As shown in FIG. 18, according to the comparative example, the opening of the groove formed by the seed layer 115 is small and it is thus difficult for the material of the magnetic film 116 to enter the groove. Consequently, according to the comparative example, defects such as key holes can easily occur in the magnetic film 116. In addition, according to the comparative example, since the surface of the seed layer 115 is rough as mentioned above, the magnetic film 116 formed thereon is poor in quality of the crystal.

Figure 19:
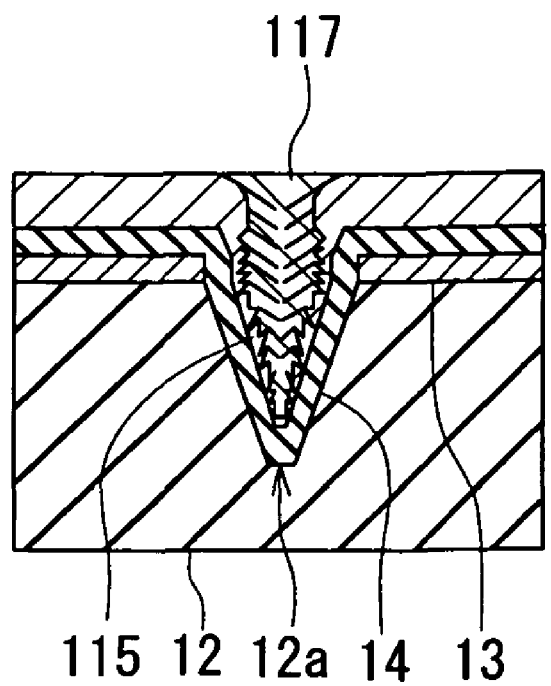
FIG. 19 is a view for explaining the method of forming the pole layer of the comparative example.

FIG. 19 illustrates a state where a magnetic film 117 to become the pole layer later has been formed by plating in the groove formed by the seed layer 115. In this case, too, since the surface of the seed layer 115 is rough as mentioned above, the magnetic film 117 formed thereon is also poor in quality of the crystal.

Figure 20:
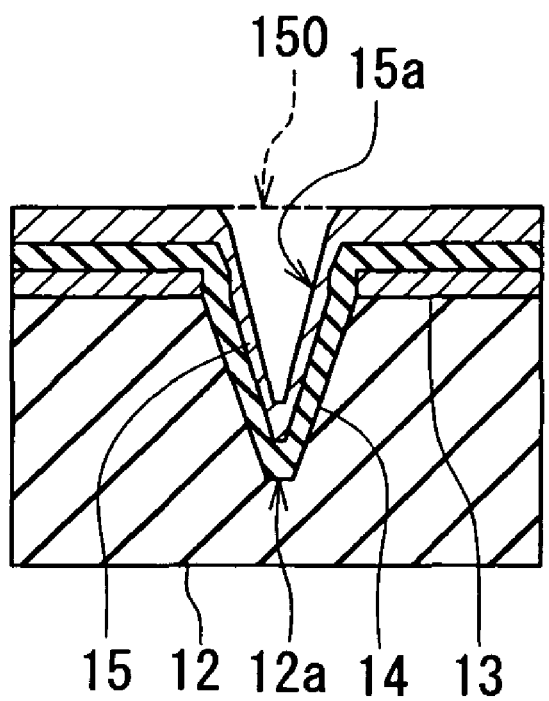
FIG. 20 is a view for explaining a method of forming the pole layer of the first embodiment of the invention.

According to the embodiment, in the step illustrated in FIG. 5A and FIG. 5B the initial nonmagnetic film 15P is first formed in the groove 12a of the pole-layer-encasing layer 12, and then in the step illustrated in FIG. 6A and FIG. 6B the surface of the initial nonmagnetic layer 15P is etched by dry etching so that the initial nonmagnetic layer 15P becomes the nonmagnetic layer 15. FIG. 20 illustrates a state where the nonmagnetic layer 15 has been formed through this etching. The initial nonmagnetic layer 15P forms the initial encasing section 15Pa, and the initial encasing section 15Pa has the opening 150. As a result of the foregoing etching, the opening 150 becomes wider than before the etching, whereby the initial encasing section 15Pa becomes the pole-layer-encasing section 15a. The pole layer 16 is then formed in this pole-layer-encasing section 15a. Thus, according to the embodiment, because the opening 150 is made wider by etching the surface of the initial nonmagnetic layer 15P, it is easy for the material of the magnetic film to enter the pole-layer-encasing section 15a when the magnetic film is formed in the pole-layer-encasing section 15a by physical vapor deposition. Consequently, according to the embodiment, it is possible to form the pole layer 16 in the pole-layer-encasing section 15a without causing any defects such as key holes in the pole layer 16.

Furthermore, according to the embodiment, by etching the surface of the initial nonmagnetic layer 15P by dry etching, the surface of the initial nonmagnetic layer 15P is smoothed, whereby a smoothed surface of the nonmagnetic layer 15 is obtained. This is because projections of the surface of the initial nonmagnetic layer 15P are removed as a result of the dry etching while recesses of the surface of the initial nonmagnetic layer 15P are filled with substances scattered from the initial nonmagnetic layer 15P due to the dry etching. According to the embodiment, since the pole layer 16 is formed on the smoothed surface of the nonmagnetic layer 15 thus obtained, it is possible to provide the pole layer 16 good in quality of the crystal.

From the foregoing, according to the embodiment, it is possible to form the pole layer 16 of good quality and consequently it is possible to improve the write characteristics of the magnetic head.

It is known that a magnetic layer formed by physical vapor deposition may have a saturation flux density higher than that of a magnetic layer formed by plating. For example, a CoFe layer formed by plating has a saturation flux density of approximately 2.3 T, whereas a CoFe layer formed by physical vapor deposition has a saturation flux density of approximately 2.4 T. According to the embodiment, it is possible to form at least part of the pole layer 16 by physical vapor deposition without causing any defects such as key holes in the pole layer 16. Consequently, according to the embodiment, in the case of forming the pole layer 16 using CoFe, for example, it is possible to increase the saturation flux density of the pole layer 16 compared with a case of forming the whole of the pole layer 16 by plating.

Furthermore, according to the embodiment, of the plurality of magnetic films 161 to 165 constituting the pole layer 16, the magnetic films 161 to 164 other than the magnetic film 165 located uppermost are each formed by: first forming an initial magnetic film by physical vapor deposition, the initial magnetic film being intended to become the magnetic film later by undergoing etching of the surface thereof; and then etching the surface of initial magnetic film by dry etching. Forming each of the magnetic films by etching the surface of the initial magnetic film as described above provides the same advantageous effects as those provided by etching the surface of the initial nonmagnetic layer 15P described previously. Consequently, according to the embodiment, it is possible to form the pole layer 16 of better quality while preventing the occurrence of any defects such as key holes in the pole layer 16 with higher reliability.

As illustrated in FIG. 1, the pole layer 16 of the embodiment includes the five magnetic films 161 to 165 stacked. At least one of the plurality of magnetic films 161 to 165, e.g., the magnetic films 161 and 162 each include a first to a third portion. The first portion is included in the track width defining portion 16A and has a first thickness in the cross section passing through the center of the pole layer 16 taken in the track width direction. The second portion is included in the wide portion 16B and has a second thickness smaller than the first thickness in the cross section passing through the center of the pole layer 16 taken in the track width direction. The third portion connects the first portion and the second portion to each other. In the cross section passing through the center of the pole layer 16 taken in the track width direction, the top surface of the third portion is inclined with respect to the direction perpendicular to the medium facing surface 30. The foregoing first to third portions result from the method of forming the pole layer 16 of the embodiment. The reasons will now be described.

According to the embodiment, as previously described, of the plurality of magnetic films 161 to 165 constituting the pole layer 16, the magnetic films 161 to 164 other than the magnetic film 165 located uppermost are each formed by: first forming an initial magnetic film by physical vapor deposition, the initial magnetic film being intended to become the magnetic film later by undergoing etching of the surface thereof and then etching the surface of the initial magnetic film by dry etching. In each of the magnetic films formed by such a method, the second portion located in the groove having a greater width corresponding to the wide portion 16B is etched deeper and thereby becomes thinner than the first portion located in the groove having a smaller width corresponding to the track width defining portion 16A. Consequently, the second thickness of the second portion becomes smaller than the first thickness of the first portion. As a result, in the cross section passing through the center of the pole layer 16 taken in the track width direction, a difference in height is formed between the top surface of the first portion and the top surface of the second portion, so that the top surface of the third portion is inclined with respect to the direction perpendicular to the medium facing surface 30. While a difference in level is formed at the bottom of the groove 12a of the pole-layer-encasing layer 12 in the example illustrated in FIG. 1, even in a case where no difference in level is formed at the bottom of the groove 12a, a magnetic film including the first to third portions is provided by the method of forming the pole layer 16 of the embodiment, because of the foregoing reasons.

In the third portion whose top surface is inclined with respect to the direction perpendicular to the medium facing surface 30 in the cross section passing through the center of the pole layer 16 taken in the track width direction, the direction of residual magnetization also tends to be inclined with respect to the direction perpendicular to the medium facing surface 30. Consequently, according to the embodiment, it is possible to suppress the formation of residual magnetization in the direction perpendicular to the medium facing surface 30 in a portion of the pole layer 16 near the medium facing surface 30 after a writing operation. It is thus possible to suppress the occurrence of the phenomenon in which data stored on a recording medium is erased due to residual magnetization in the pole layer 16 after a writing operation.

According to the embodiment, of the plurality of magnetic films 161 to 165 constituting the pole layer 16, the magnetic films 161 to 164 other than the magnetic film 165 located uppermost are each formed by: first forming an initial magnetic film by physical vapor deposition, the initial magnetic film being intended to become the magnetic film later by undergoing etching of the surface thereof and then etching the surface of the initial magnetic film by dry etching. Thus, according to the embodiment, the magnetic films 161 to 164 are not formed successively in one and the same chamber, but formed by alternately repeating the formation of an initial magnetic film by physical vapor deposition and the etching of the surface of the initial magnetic film by dry etching. Consequently, in the pole layer 16 of the embodiment, interfaces respectively exist between vertically adjacent ones of the magnetic films. The interfaces are recognizable by observing the cross section of the pole layer 16 with a high-resolution electron microscope. In a region near those interfaces, residual magnetization in a direction intersecting those interfaces is hard to be generated. Consequently, the foregoing advantageous effect of the third portion is exerted.

Furthermore, according to the embodiment, of the plurality of magnetic films 161 to 165 constituting the pole layer 16, the magnetic film 165 located uppermost may be formed to have a saturation flux density different from that of each of the other magnetic films 161 to 164. In this case, an interface between the magnetic film 165 and the magnetic film 164 having different characteristics is formed in the pole layer 16. As shown in FIG. 1, a portion of this interface near the boundary between the track width defining portion 16A and the wide portion 16B is inclined with respect to the direction perpendicular to the medium facing surface 30. In a region near this portion, residual magnetization in the direction perpendicular to the medium facing surface 30 is hard to be generated. This also serves to suppress the generation of residual magnetization in the direction perpendicular to the medium facing surface 30 in a portion of the pole layer 16 near the medium facing surface 30, and it is therefore possible to suppress the occurrence of the above-mentioned phenomenon.

Second Embodiment

Figure 21:
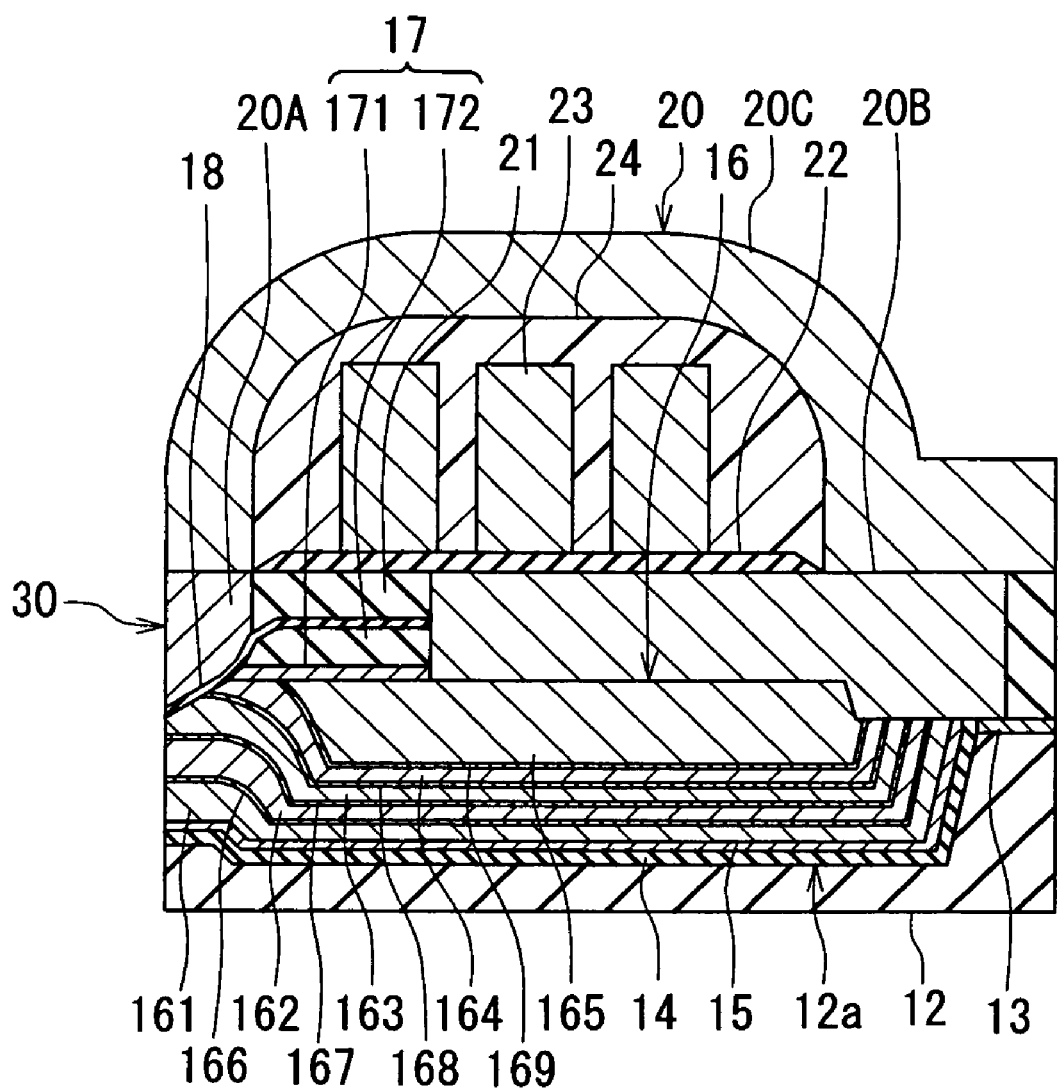
FIG. 21 is a cross-sectional view illustrating the configuration of a magnetic head of a second embodiment of the invention.

A magnetic head and a method of manufacturing the same of a second embodiment of the invention will now be described. Reference is now made to FIG. 21 to describe the configuration of the magnetic head of the second embodiment. FIG. 21 is a cross-sectional view illustrating the configuration of the magnetic head for perpendicular magnetic recording of the second embodiment. FIG. 21 shows a cross section that is perpendicular to the medium facing surface and the top surface of the substrate, and that passes through the center of the pole layer taken in the track width direction. The protection layer 25 and the portion closer to the substrate 1 than the pole-layer-encasing layer 12 are omitted in FIG. 21.

The pole layer 16 of the second embodiment includes, in addition to the plurality of magnetic films 161 to 165 stacked on the nonmagnetic layer 15, nonmagnetic films made of a nonmagnetic material and respectively inserted between vertically adjacent ones of the magnetic films. Specifically, the pole layer 16 includes a nonmagnetic film 166 inserted between the magnetic films 161 and 162, a nonmagnetic film 167 inserted between the magnetic films 162 and 163, a nonmagnetic film 168 inserted between the magnetic films 163 and 164, and a nonmagnetic film 169 inserted between the magnetic films 164 and 165. The nonmagnetic films 166 to 169 are made of a nonmagnetic metal material or an inorganic insulating material, for example. The nonmagnetic metal material for use to form the nonmagnetic films 166 to 169 may be the same material as the nonmagnetic metal layer 13, for example. The inorganic insulating material for use to form the nonmagnetic films 166 to 169 may be alumina, for example. The nonmagnetic films 166 to 169 each have a thickness of 1 to 5 nm, for example.

In the method of manufacturing the magnetic head of the second embodiment, the magnetic films 161 to 165 and the nonmagnetic films 166 to 169 are alternately formed in the step of forming the pole layer 16. The method of forming the magnetic films 161 to 165 is the same as the first embodiment. The nonmagnetic films 166 to 169 are formed by IBD or sputtering, for example.

In the magnetic head of the second embodiment, since the nonmagnetic films are respectively inserted between vertically adjacent ones of the magnetic films in the pole layer 16, residual magnetization in a direction intersecting the planes of the nonmagnetic films is hard to be generated near the nonmagnetic films. As a result, according to the second embodiment, noticeably exerted is the advantageous effect that the presence of the third portion in at least one of the magnetic films makes it possible to suppress the occurrence of the phenomenon in which data stored on the recording medium is erased due to residual magnetization in the pole layer 16 after a writing operation.

The remainder of configuration, function and effects of the second embodiment are similar to those of the first embodiment.

Third Embodiment

Figure 22:
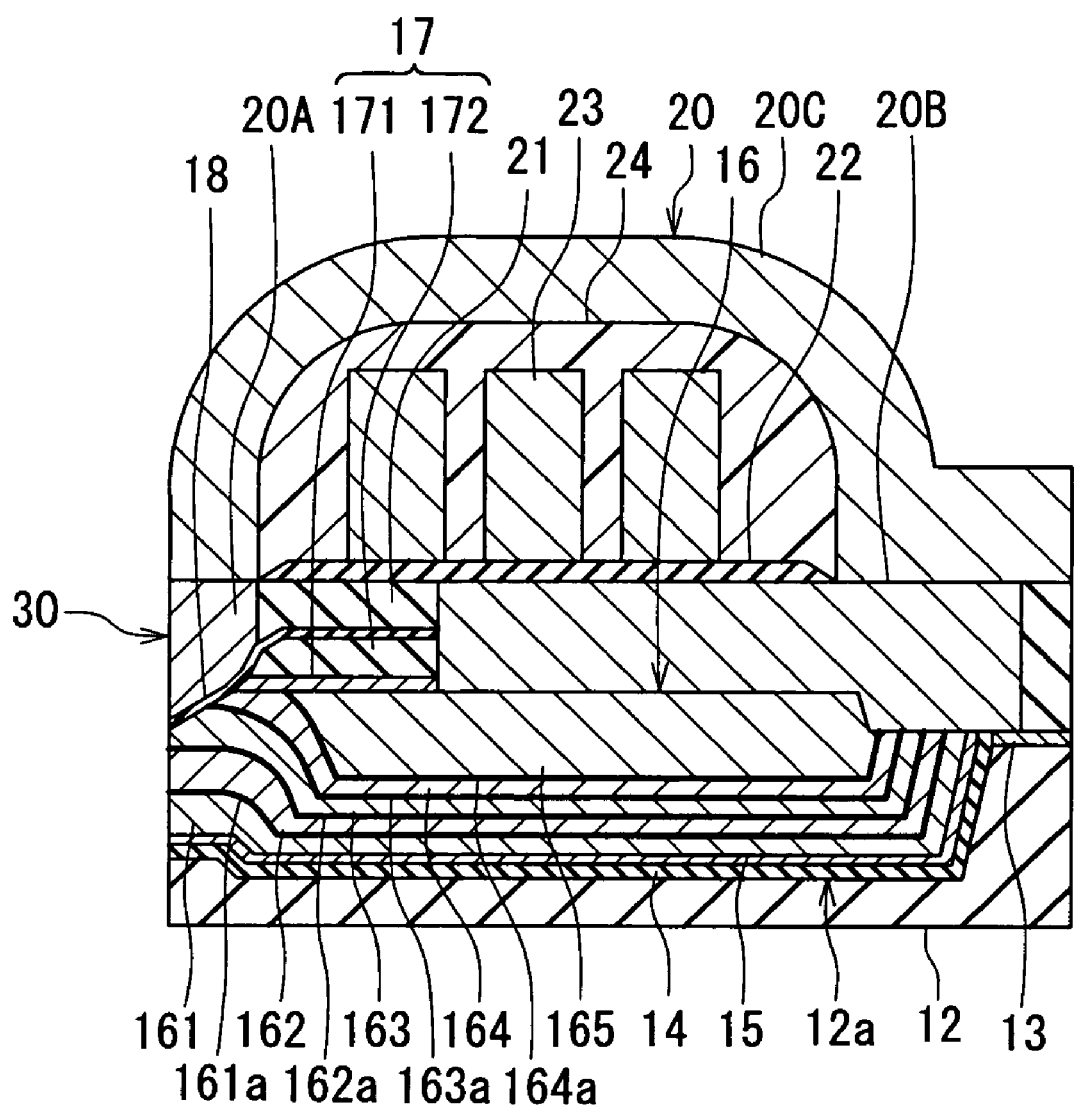
FIG. 22 is a cross-sectional view illustrating the configuration of a magnetic head of a third embodiment of the invention.

A magnetic head and a method of manufacturing the same of a third embodiment of the invention will now be described. Reference is now made to FIG. 22 to describe the configuration of the magnetic head of the third embodiment. FIG. 22 is a cross-sectional view illustrating the configuration of the magnetic head for perpendicular magnetic recording of the third embodiment. FIG. 22 shows a cross section that is perpendicular to the medium facing surface and the top surface of the substrate, and that passes through the center of the pole layer taken in the track width direction. The protection layer 25 and the portion closer to the substrate 1 than the pole-layer-encasing layer 12 are omitted in FIG. 22.

The pole layer 16 of the third embodiment includes, in addition to the plurality of magnetic films 161 to 165 stacked on the nonmagnetic layer 15, oxide magnetic material films respectively inserted between vertically adjacent ones of the magnetic films. Specifically, the pole layer 16 includes an oxide magnetic material film 161a inserted between the magnetic films 161 and 162, an oxide magnetic material film 162a inserted between the magnetic films 162 and 163, an oxide magnetic material film 163a inserted between the magnetic films 163 and 164, and an oxide magnetic material film 164a inserted between the magnetic films 164 and 165. The magnetic films 161 to 165 are made of a magnetic metal material. The oxide magnetic material films 161a, 162a, 163a and 164a are made of an oxide magnetic material. The oxide magnetic material films 161a, 162a, 163a and 164a each have a thickness of 0.2 to 2.0 nm, for example.

The step of forming the pole layer 16 of the embodiment includes: a step forming a magnetic metal material film made of a magnetic metal material; and a step of subjecting the surface of the magnetic metal material film to oxidation using plasma, for example, thereby forming an oxide magnetic material film from an oxidized portion of the magnetic metal material film and forming a magnetic film from a non-oxidized portion of the 5 magnetic metal material film. The magnetic films 161 to 164 and the oxide magnetic material films 161a, 162a, 163a and 164a are formed by repeating the above-described two steps. For example, when CoFe is employed as the magnetic metal material to form the magnetic metal material film, the magnetic films 161 to 164 are formed of CoFe while the oxide magnetic material films 161a, 162a, 163a and 164a are formed of cobalt iron oxide.

According to the magnetic head of the third embodiment, since the oxide magnetic material films are respectively inserted between vertically adjacent ones of the magnetic films, residual magnetization in a direction intersecting the planes of the oxide magnetic material films is hard to be generated near the oxide magnetic material films. As a result, according to the third embodiment, noticeably exerted is the advantageous effect that the presence of the third portion in at least one of the magnetic films makes it possible to suppress the occurrence of the phenomenon in which data stored on the recording medium is erased due to residual magnetization in the pole layer 16 after a writing operation.

The remainder of configuration, function and effects of the third embodiment are similar to those of the first embodiment.

Fourth Embodiment

Figures 23A, 23B:
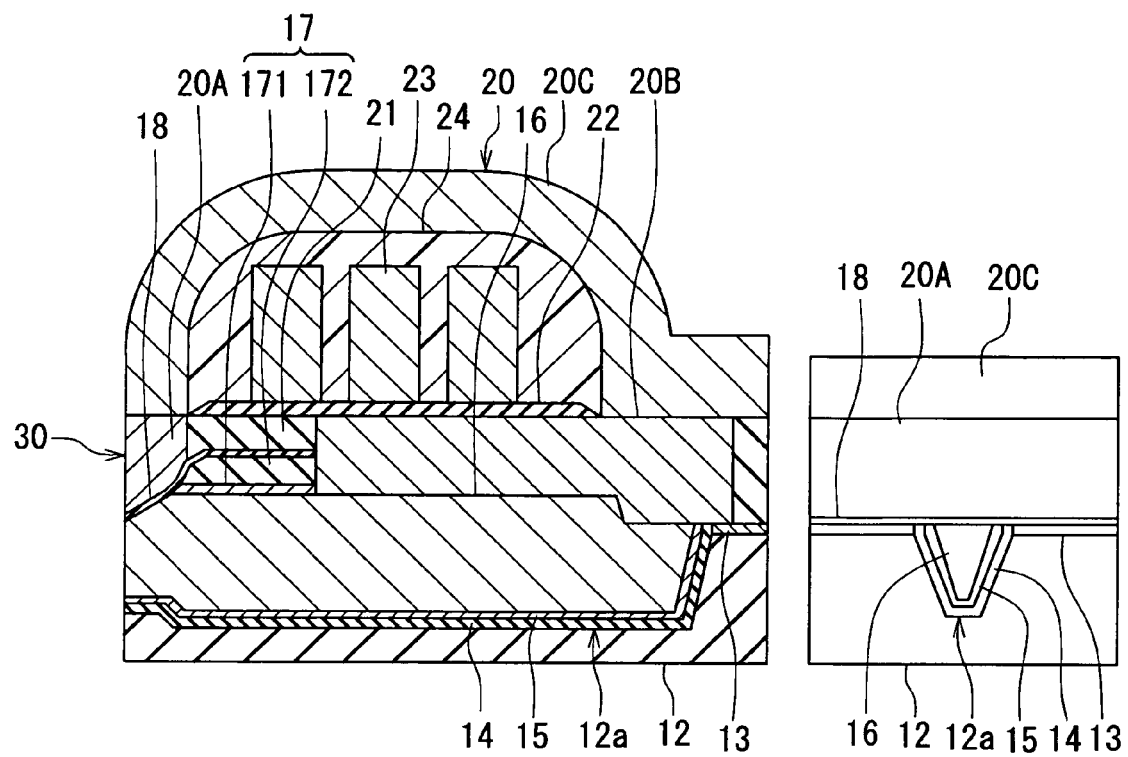
FIG. 23A is a cross-sectional view illustrating the configuration of a magnetic head of a fourth embodiment of the invention.
FIG. 23B is a front view of the medium facing surface of the magnetic head of the fourth embodiment of the invention.

A magnetic head and a method of manufacturing the same of a fourth embodiment of the invention will now be described. Reference is now made to FIG. 23A and FIG. 23B to describe the configuration of the magnetic head of the fourth embodiment. FIG. 23A is a cross-sectional view illustrating the configuration of the magnetic head for perpendicular magnetic recording of the fourth embodiment. FIG. 23A shows a cross section that is perpendicular to the medium facing surface and the top surface of the substrate, and that passes through the center of the pole layer taken in the track width direction. FIG. 23B is a front view of the medium facing surface of the magnetic head of the fourth embodiment. The protection layer 25 and the portion closer to the substrate 1 than the pole-layer-encasing layer 12 are omitted in each of FIG. 23A and FIG. 23B. The pole layer 16 of the fourth embodiment is entirely formed by plating. The remainder of configuration of the fourth embodiment is the same as that of the first embodiment.

Figures 24A, 24B:
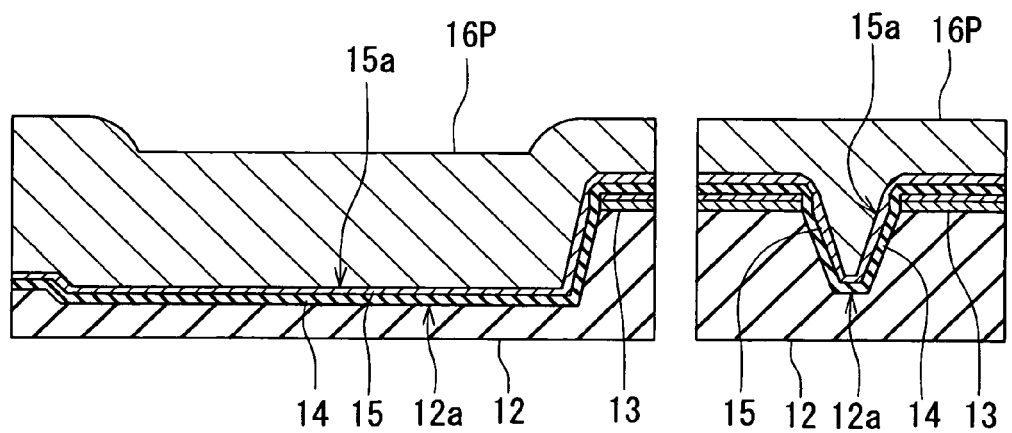
FIG. 24A and FIG. 24B are views illustrating a step of a method of manufacturing the magnetic head of the fourth embodiment of the invention.

Reference is now made to FIG. 24A and FIG. 24B to describe the method of manufacturing the magnetic head of the fourth embodiment. The steps of the method of manufacturing the magnetic head of the fourth embodiment are the same as those of the first embodiment up to the step illustrated in FIG. 6A and FIG. 6B.

FIG. 24A and FIG. 24B illustrate the next step. In this step, a magnetic film 16P to become the pole layer 16 later is formed on the nonmagnetic layer 15 by plating. The magnetic film 16P is formed such that the pole-layer-encasing section 15a is filled with the magnetic film 16P and that the top surface of the magnetic film 16P is located higher than the top surface of the nonmagnetic layer 15.

Next, a coating layer (not shown) made of alumina, for example, is formed to have a thickness of 0.5 to 1.2 mm, for example, over the entire top surface of the stack of layers. Next, the coating layer and the magnetic film 16P are polished by CMP, for example, until the nonmagnetic layer 15 is exposed, and the top surface of the nonmagnetic layer 15 and the magnetic layer 16P are thereby flattened. The steps that follow are the same as the steps illustrated in FIG. 12A and FIG. 12B and subsequent figures of the first embodiment.

According to the fourth embodiment, the pole layer 16 is formed by plating on the smoothed surface of the nonmagnetic layer 15. Consequently, according to the embodiment, it is possible to form the pole layer 16 good in quality of the crystal.

The remainder of function and effects of the fourth embodiment are the same as those of the first embodiment, except the function and effects provided by forming the pole layer 16 with the plurality of magnetic films 161 to 165 in the first embodiment.

Fifth Embodiment

A magnetic head and a method of manufacturing the same of a fifth embodiment of the invention will now be described. Reference is now made to FIG. 25A and FIG. 25B to describe the configuration of the magnetic head of the fifth embodiment. FIG. 25A is a cross-sectional view illustrating the configuration of the magnetic head for perpendicular magnetic recording of the fifth embodiment. FIG. 25A shows a cross section that is perpendicular to the medium facing surface and the top surface of the substrate, and that passes through the center of the pole layer taken in the track width direction. FIG. 25B is a front view of the medium facing surface of the magnetic head of the fifth embodiment. The protection layer 25 and the portion closer to the substrate 1 than the pole-layer-encasing layer 12 are omitted in each of FIG. 25A and FIG. 25B.

The magnetic head of the fifth embodiment does not include the nonmagnetic layer 15 of the first embodiment. In the fifth embodiment, the groove 12a of the pole-layer-encasing layer 12 constitutes a pole-layer-encasing section. The pole layer 16 of the fifth embodiment includes a first layer 61 made of a magnetic material, and a second layer 62 formed on the first layer 61. The first layer 61 is placed in the groove 12a of the pole-layer-encasing layer 12 and in the opening 13a of the nonmagnetic metal layer 13. The nonmagnetic film 14 is disposed between the surface of the groove 12a and the first layer 61.

The second layer 62 includes a plurality of magnetic films stacked. Here, by way of example, the second layer 62 includes five magnetic films 621, 622, 623, 624 and 625 stacked. The configuration of the magnetic films 621 to 625 is the same as the configuration of the magnetic films 161 to 165 of the first embodiment.

The method of manufacturing the magnetic head of the fifth embodiment will now be described. The steps of the method of manufacturing the magnetic head of the fifth embodiment are the same as those of the first embodiment up to forming the nonmagnetic film 14 in the step illustrated in FIG. 5A and FIG. 5B.

In the fifth embodiment, next, an initial first layer is formed by physical vapor deposition, in place of the initial nonmagnetic layer 15P of the first embodiment, the initial first layer being intended to become the first layer 61 later by undergoing etching of the surface thereof. The initial first layer forms a groove having an opening. This step is the same as the step described with reference to FIG. 5A and FIG. 5B in the first embodiment, except that the initial nonmagnetic layer 15P of the first embodiment is replaced with the initial first layer.

Next, the surface of the initial first layer is etched by dry etching so that the initial first layer becomes the first layer 61. In this step, the surface of the initial first layer is etched such that the opening of the groove formed by the initial first layer becomes wider than before the etching. This step is the same as the step described with reference to FIG. 6A and FIG. 6B in the first embodiment, except that the initial nonmagnetic layer 15P of the first embodiment is replaced with the initial first layer and the nonmagnetic layer 15 of the first embodiment is replaced with the first layer 61.

Next, on the first layer 61 the magnetic films 621 to 625 constituting the second layer 62 are formed one by one. The series of steps is the same as the series of steps of forming the magnetic films 161 to 165 one by one described with reference to FIG. 7A to FIG. 10B in the first embodiment.

FIG. 26A and FIG. 26B illustrate the next step. In this step, first, a coating layer (not shown) made of alumina, for example, is formed to have a thickness of 0.5 to 1.2 µm, for example, over the entire top surface of the stack of layers. Next, the coating layer and the magnetic films 621 to 625 are polished by CMP, for example, until the nonmagnetic metal layer 13 is exposed, and the top surface of the nonmagnetic metal layer 13 and the magnetic films 621 to 625 are thereby flattened. In the case of polishing the coating layer and the magnetic films 621 to 625 by CMP, such a slurry is used that polishing is stopped when the nonmagnetic metal layer 13 is exposed, such as an alumina-base slurry.

The steps that follow are the same as the steps described with reference to FIG. 12A and FIG. 12B and subsequent figures in the first embodiment.

According to the fifth embodiment, after the initial first layer is formed in the groove 12a of the pole-layer-encasing layer 12, the surface of the initial first layer is etched by dry etching so that the initial first layer becomes the first layer 61. As a result of this etching, the opening of the groove formed by the initial first layer becomes wider than before the etching. Subsequently, on the first layer 61 the magnetic films 621 to 625 constituting the second layer 62 are formed one by one. Thus, according to the fifth embodiment, since the above-mentioned opening is made wider by etching the surface of the initial first layer, it is possible to form the pole layer 16 without causing any defects such as key holes in the second layer 62.

Furthermore, according to the fifth embodiment, by etching the surface of the initial first layer, the surface of the initial first layer is smoothed, whereby a smoothed surface of the first layer 61 is formed. According to the embodiment, since the second layer 62 is formed on the smoothed surface of the first layer 61, it is possible to make the second layer 62 good in quality of the crystal.

From the foregoing, according to the embodiment, it is possible to form the pole layer 16 of good quality and consequently it is possible to improve the write characteristics of the magnetic head.

The remainder of configuration, function and effects of the fifth embodiment are similar to those of the first embodiment. The function and effects provided by forming the second layer 62 with the plurality of magnetic films 621 to 625 in the fifth embodiment are the same as the function and effects provided by forming the pole layer 16 with the plurality of magnetic films 161 to 165 in the first embodiment.

Sixth Embodiment

Figure 27:
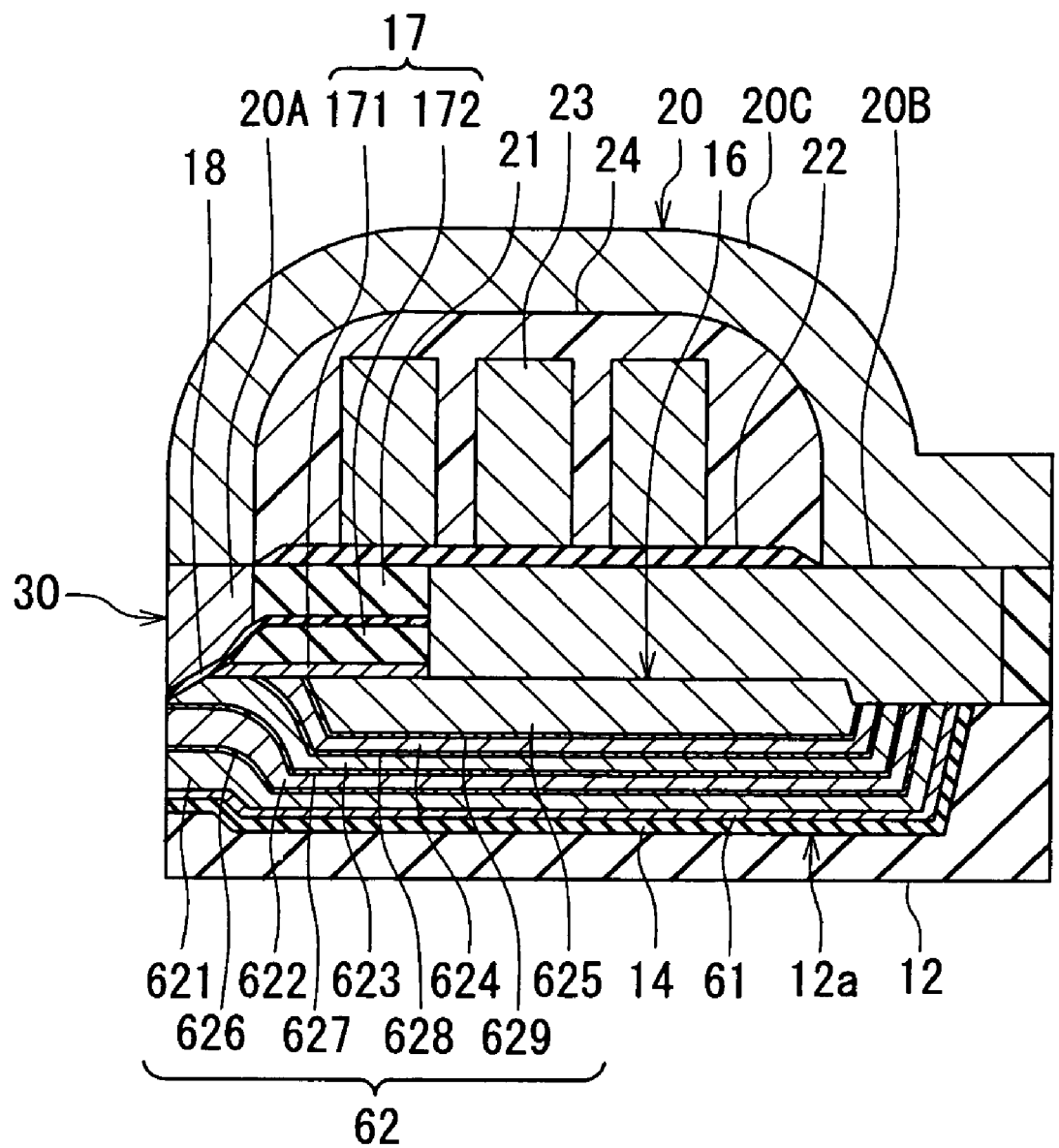
FIG. 27 is a cross-sectional view illustrating the configuration of a magnetic head of a sixth embodiment of the invention.

A magnetic head and a method of manufacturing the same of a sixth embodiment of the invention will now be described. Reference is now made to FIG. 27 to describe the configuration of the magnetic head of the sixth embodiment. FIG. 27 is a cross-sectional view illustrating the configuration of the magnetic head for perpendicular magnetic recording of the sixth embodiment. FIG. 27 shows a cross section that is perpendicular to the medium facing surface and the top surface of the substrate, and that passes through the center of the pole layer taken in the track width direction. The protection layer 25 and the portion closer to the substrate 1 than the pole-layer-encasing layer 12 are omitted in FIG. 27.

The pole layer 16 of the sixth embodiment includes the first layer 61 and the second layer 62, like the fifth embodiment. The second layer 62 of the sixth embodiment includes, in addition to the plurality of magnetic films 621 to 625 stacked on the first layer 61, nonmagnetic films made of a nonmagnetic material and respectively inserted between vertically adjacent ones of the magnetic films. Specifically, the second layer 62 includes a nonmagnetic film 626 inserted between the magnetic films 621 and 622, a nonmagnetic film 627 inserted between the magnetic films 622 and 623, a nonmagnetic film 628 inserted between the magnetic films 623 and 624, and a nonmagnetic film 629 inserted between the magnetic films 624 and 625. Materials employable to form the nonmagnetic films 626 to 629 are the same as those employable to form the nonmagnetic films 166 to 169 of the second embodiment. The nonmagnetic films 626 to 629 each have a thickness within a range of 1 to 5 nm, for example.

In the method of manufacturing the magnetic head of the sixth embodiment, the magnetic films 621 to 625 and the nonmagnetic films 626 to 629 are alternately formed in the step of forming the second layer 62. The method of forming the magnetic films 621 to 625 is the same as the fifth embodiment. The nonmagnetic films 626 to 629 are formed by IBD or sputtering, for example.

In the magnetic head of the sixth embodiment, since the nonmagnetic films are respectively inserted between vertically adjacent ones of the magnetic films in the pole layer 16, residual magnetization in a direction intersecting the planes of the nonmagnetic films is hard to be generated near the nonmagnetic films. As a result, according to the sixth embodiment, like the second embodiment, noticeably exerted is the advantageous effect that the presence of the third portion in at least one of the magnetic films makes it possible to suppress the occurrence of the phenomenon in which data stored on the recording medium is erased due to residual magnetization in the pole layer 16 after a writing operation.

The remainder of configuration, function and effects of the sixth embodiment are similar to those of the fifth embodiment.

Seventh Embodiment

Figure 28:
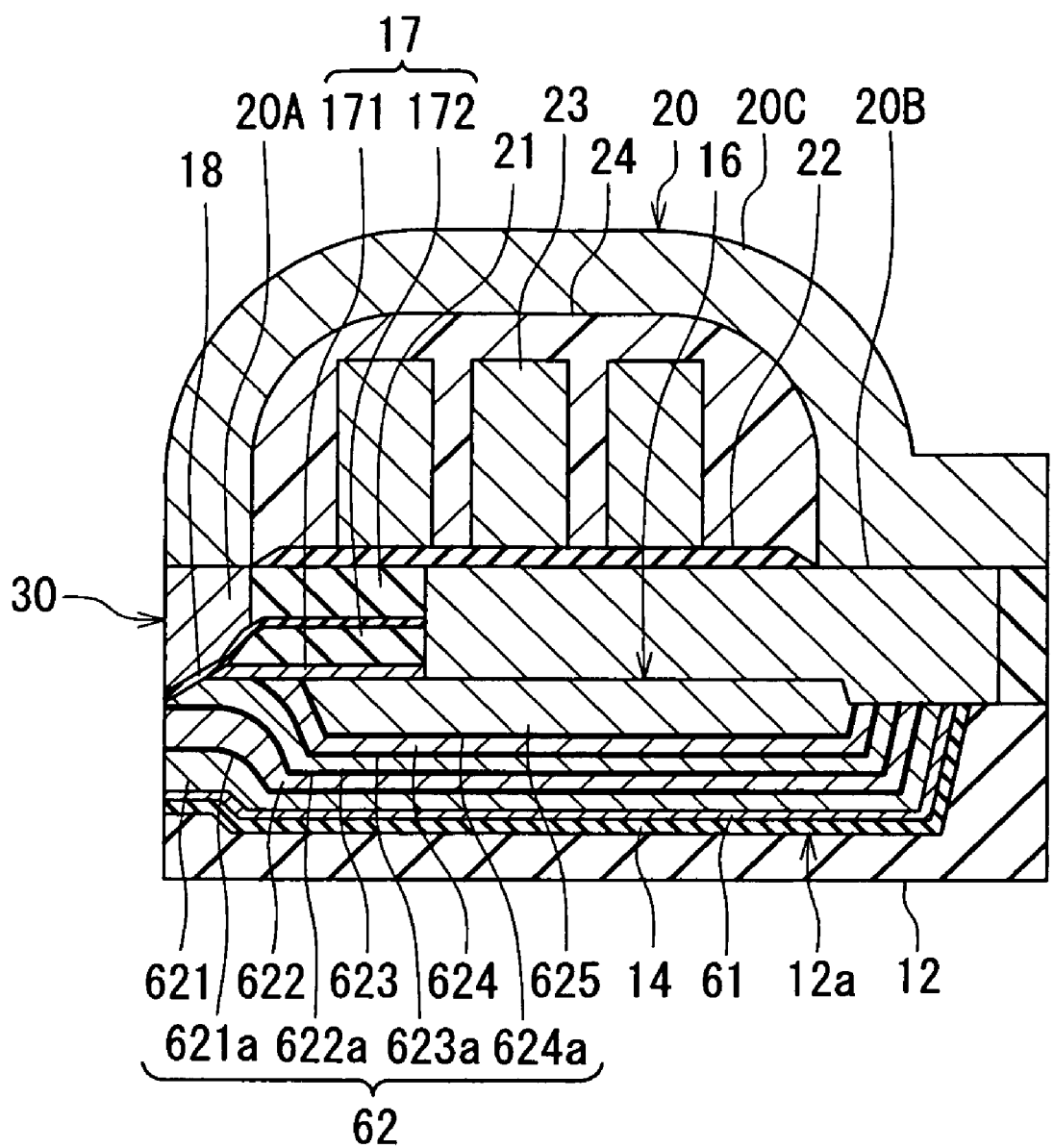
FIG. 28 is a cross-sectional view illustrating the configuration of a magnetic head of a seventh embodiment of the invention.

A magnetic head and a method of manufacturing the same of a seventh embodiment of the invention will now be described. Reference is now made to FIG. 28 to describe the configuration of the magnetic head of the seventh embodiment. FIG. 28 is a cross-sectional view illustrating the configuration of the magnetic head for perpendicular magnetic recording of the seventh embodiment. FIG. 28 shows a cross section that is perpendicular to the medium facing surface and the top surface of the substrate, and that passes through the center of the pole layer taken in the track width direction. The protection layer 25 and the portion closer to the substrate 1 than the pole-layer-encasing layer 12 are omitted in FIG. 28.

The pole layer 16 of the seventh embodiment includes the first layer 61 and the second layer 62, like the fifth embodiment. The second layer 62 of the seventh embodiment includes, in addition to the plurality of magnetic films 621 to 625 stacked on the first layer 61, oxide magnetic material films respectively inserted between vertically adjacent ones of the magnetic films. Specifically, the second layer 62 includes an oxide magnetic material film 621a inserted between the magnetic films 621 and 622, an oxide magnetic material film 622a inserted between the magnetic films 622 and 623, an oxide magnetic material film 623a inserted between the magnetic films 623 and 624, and an oxide magnetic material film 624a inserted between the magnetic films 624 and 625. The magnetic films 621 to 625 are made of a magnetic metal material. The oxide magnetic material films 621a, 622a, 623a and 624a are made of an oxide magnetic material. The oxide magnetic material films 621a, 622a, 623a and 624a each have a thickness of 0.2 to 2.0 nm, for example.

The step of forming the second layer 62 of the seventh embodiment includes: a step forming a magnetic metal material film made of a magnetic metal material; and a step of subjecting the surface of the magnetic metal material film to oxidation using plasma, for example, thereby forming an oxide magnetic material film from an oxidized portion of the magnetic metal material film and forming a magnetic film from a non-oxidized portion of the magnetic metal material film. The magnetic films 621 to 624 and the oxide magnetic material films 621a, 622a, 623a and 624a are formed by repeating the above-described two steps. For example, when CoFe is employed as the magnetic metal material to form the magnetic metal material film, the magnetic films 621 to 624 are formed of CoFe while the oxide magnetic material films 621*a*, 622*a*, 623*a* and 624*a* are formed of cobalt iron oxide.

According to the magnetic head of the seventh embodiment, since the oxide magnetic material films are respectively inserted between vertically adjacent ones of the magnetic films, residual magnetization in a direction intersecting the planes of the oxide magnetic material films is hard to be generated near the oxide magnetic material films. As a result, according to the seventh embodiment, like the third embodiment, noticeably exerted is the advantageous effect that the presence of the third portion in at least one of the magnetic films makes it possible to suppress the occurrence of the phenomenon in which data stored on the recording medium is erased due to residual magnetization in the pole layer 16 after a writing operation.

The remainder of configuration, function and effects of the seventh embodiment are similar to those of the fifth embodiment.

Eighth Embodiment

Figure 29A:
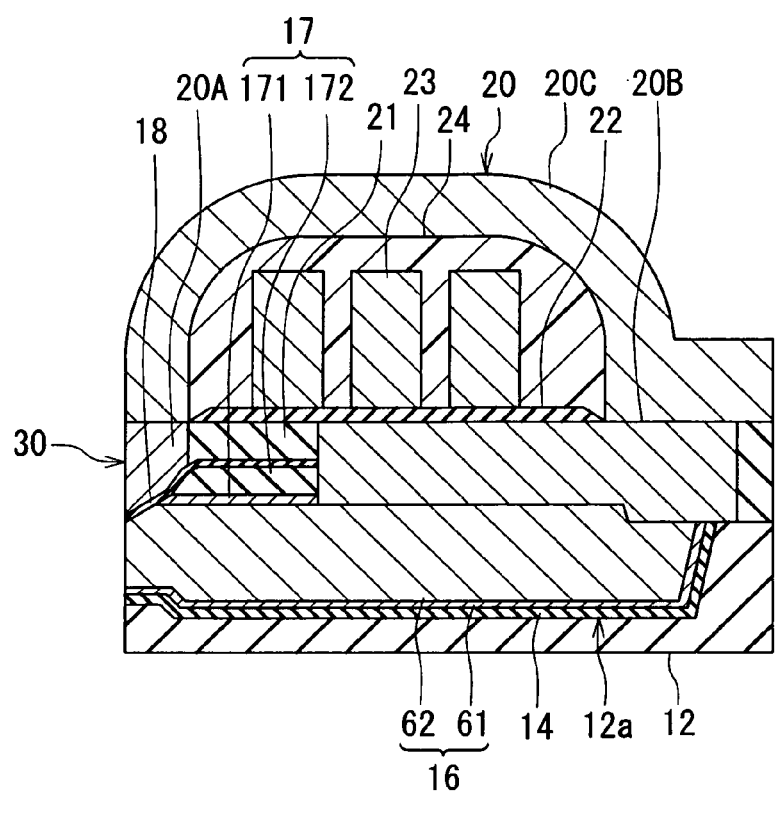
FIG. 29A is a cross-sectional view illustrating the configuration of a magnetic head of an eighth embodiment of the invention.
Figure 29B:
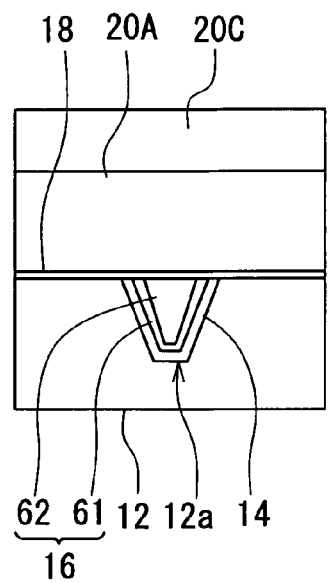
FIG. 29B is a front view of the medium facing surface of the magnetic head of the eighth embodiment of the invention.

A magnetic head and a method of manufacturing the same of an eighth embodiment of the invention will now be described. Reference is now made to FIG. 29A and FIG. 29B to describe the configuration of the magnetic head of the eighth embodiment. FIG. 29A is a cross-sectional view illustrating the configuration of the magnetic head for perpendicular magnetic recording of the eighth embodiment. FIG. 29A shows a cross section that is perpendicular to the medium facing surface and the top surface of the substrate, and that passes through the center of the pole layer taken in the track width direction. FIG. 29B is a front view of the medium facing surface of the magnetic head of the embodiment. The protection layer 25 and the portion closer to the substrate 1 than the pole-layer-encasing layer 12 are omitted in each of FIG. 29A and FIG. 29B.

The pole layer 16 of the eighth embodiment includes the first layer 61 and the second layer 62, like the fifth embodiment. The second layer 62 of the eighth embodiment is entirely formed by plating. The remainder of configuration of the eighth embodiment is the same as that of the fifth embodiment.

The method of manufacturing the magnetic head of the eighth embodiment will now be described. The steps of the method of manufacturing the magnetic head of the eighth embodiment are the same as those of the fifth embodiment up to the step of forming the first layer 61 of the pole layer 16. In the next step of the eighth embodiment, a magnetic film to become the second layer 62 later is formed on the first layer 61 by plating. This magnetic film is formed such that the groove formed by the first layer 61 is filled with this magnetic film and that the top surface of this magnetic film is located higher than the top surface of the first layer 61.

Next, a coating layer (not shown) made of alumina, for example, is formed to have a thickness of 0.5 to 1.2 μm, for example, over the entire top surface of the stack of layers. Next, the coating layer, the magnetic film and the first layer 61 are polished by CMP, for example, until the nonmagnetic metal layer 13 is exposed, and the top surfaces of the nonmagnetic metal layer 13, the first layer 61 and the magnetic film are thereby flattened. The steps that follow are the same as the steps described with reference to FIG. 12A and FIG. 12B and subsequent figures in the first embodiment.

According to the eighth embodiment, the second layer 62 is formed by plating on the smoothed surface of the first layer 61. Consequently, according to the embodiment, it is possible to form the second layer 62 good in quality of the crystal.

The remainder of function and effects of the eighth embodiment are the same as those of the fifth embodiment, except the function and effects provided by forming the second layer 62 with the plurality of magnetic films 621 to 625 in the fifth embodiment.

The present invention is not limited to the foregoing embodiments but can be carried out in various modifications. For example, in the present invention, the top surface and the bottom surface of the pole layer 16 may be flat.

In addition, in each of the foregoing embodiments, a coil helically wound around the pole layer 16 may be provided in place of the planar spiral-shaped coils 9 and 23.

While the foregoing embodiments have been described with reference to a magnetic head having a structure in which the read head is formed on the base body and the write head is stacked on the read head, the read head and the write head may be stacked in the reverse order.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A method of manufacturing a magnetic head for perpendicular magnetic recording, the magnetic head comprising:
   a medium facing surface that faces toward a recording medium;
   a coil that generates a magnetic field corresponding to data to be written on the recording medium;
   a pole layer that allows a magnetic flux corresponding to the magnetic field generated by the coil to pass therethrough and generates a write magnetic field for writing the data on the recording medium by means of a perpendicular magnetic recording system;
   a pole-layer-encasing layer made of a nonmagnetic material and having a top surface and a groove that opens at the top surface; and
   a nonmagnetic layer that is made of a nonmagnetic metal material, disposed in the groove and forms a pole-layer-encasing section that accommodates the pole layer,
   the method comprising the steps of:
   forming the pole-layer-encasing layer;
   forming an initial nonmagnetic layer in the groove of the pole-layer-encasing layer by physical vapor deposition, the initial nonmagnetic layer being intended to become the nonmagnetic layer later by undergoing etching of a surface thereof;
   etching the surface of the initial nonmagnetic layer by dry etching so that the initial nonmagnetic layer becomes the nonmagnetic layer;
   forming the pole layer in the pole-layer-encasing section formed by the nonmagnetic layer; and
   forming the coil, wherein:
   the initial nonmagnetic layer forms an initial encasing section that is to become the pole-layer-encasing section later, the initial encasing section having an opening; and
   in the step of etching the surface of the initial nonmagnetic layer, the surface of the initial nonmagnetic layer is etched so that the opening becomes wider than before the etching and the initial encasing section thereby becomes the pole-layer-encasing section.

2. The method of manufacturing the magnetic head for perpendicular magnetic recording according to claim 1, wherein the pole layer has: a track width defining portion that defines a track width, the track width defining portion including a first end located in the medium facing surface and a second end opposite to the first end; and a wide portion coupled to the second end of the track width defining portion and having a width greater than that of the track width defining portion.

3. The method of manufacturing the magnetic head for perpendicular magnetic recording according to claim 1, wherein the pole layer has an end face located in the medium facing surface, and this end face has a width that decreases with increasing distance from the top surface of the pole-layer-encasing layer.

4. The method of manufacturing the magnetic head for perpendicular magnetic recording according to claim 1, wherein the surface of the initial nonmagnetic layer is smoothed through the step of etching the surface of the initial nonmagnetic layer.

5. The method of manufacturing the magnetic head for perpendicular magnetic recording according to claim 1, wherein the step of etching the surface of the initial nonmagnetic layer is performed by ion beam etching.

6. The method of manufacturing the magnetic head for perpendicular magnetic recording according to claim 1, wherein:
the magnetic head further comprises a substrate on which the pole-layer-encasing layer, the nonmagnetic layer, the pole layer and the coil are stacked;
the groove of the pole-layer-encasing layer has two walls located on opposite sides in a track width direction, and the two walls are each inclined at a first angle with respect to a direction perpendicular to a top surface of the substrate so that a distance between the two walls decreases with decreasing distance from the top surface of the substrate; and
the step of etching the surface of the initial nonmagnetic layer is performed by ion beam etching such that a direction of travel of ion beams forms a second angle greater than the first angle with respect to the direction perpendicular to the top surface of the substrate.

7. The method of manufacturing the magnetic head for perpendicular magnetic recording according to claim 1, wherein, in the step of forming the pole layer, at least part of the pole layer is formed by physical vapor deposition.

8. The method of manufacturing the magnetic head for perpendicular magnetic recording according to claim 1, wherein, in the step of forming the pole layer, at least part of the pole layer is formed by plating.

9. The method of manufacturing the magnetic head for perpendicular magnetic recording according to claim 1, wherein:
the pole layer includes a plurality of magnetic films stacked on the nonmagnetic layer; and
in the step of forming the pole layer, each of the plurality of magnetic films except one located uppermost is formed by: first forming an initial magnetic film by physical vapor deposition, the initial magnetic film being intended to become the magnetic film later by undergoing etching of a surface thereof; and then etching the surface of the initial magnetic film by dry etching so that the initial magnetic film becomes the magnetic film.

10. The method of manufacturing the magnetic head for perpendicular magnetic recording according to claim 9, wherein the one of the plurality of magnetic films located uppermost is formed by plating.

11. The method of manufacturing the magnetic head for perpendicular magnetic recording according to claim 1, wherein:
the pole layer includes: a plurality of magnetic films stacked on the nonmagnetic layer; and a nonmagnetic film made of a nonmagnetic material and inserted between vertically adjacent ones of the magnetic films; and
the magnetic films and the nonmagnetic film are alternately formed in the step of forming the pole layer.

12. The method of manufacturing the magnetic head for perpendicular magnetic recording according to claim 1, wherein:
the pole layer includes: a plurality of magnetic films stacked on the nonmagnetic layer and each made of a magnetic metal material; and an oxide magnetic material film made of an oxide magnetic material and inserted between vertically adjacent ones of the magnetic films; and
the step of forming the pole layer includes: a step of forming a magnetic metal material film made of a magnetic metal material; and a step of subjecting a surface of the magnetic metal material film to oxidation, thereby forming the oxide magnetic material film from an oxidized portion of the magnetic metal material film and forming the magnetic film from a non-oxidized portion of the magnetic metal material film.

* * * * *